US012363818B2

(12) United States Patent
Dingemans et al.

(10) Patent No.: US 12,363,818 B2
(45) Date of Patent: Jul. 15, 2025

(54) EUV RADIATION SYSTEM INCLUDING MAXIMIZING DROPLET VELOCITY CHANGE TRANSVERSE TO MAIN PULSE PROPAGATION

(71) Applicant: ASML Netherlands B.V., Veldhoven (NL)

(72) Inventors: Gijs Dingemans, Eindhoven (NL); Colm O'Gorman, Eindhoven (NL); Ruben Haverkort, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 495 days.

(21) Appl. No.: 17/600,759

(22) PCT Filed: Mar. 3, 2020

(86) PCT No.: PCT/EP2020/055514
§ 371 (c)(1),
(2) Date: Oct. 1, 2021

(87) PCT Pub. No.: WO2020/200610
PCT Pub. Date: Oct. 8, 2020

(65) Prior Publication Data

US 2022/0201831 A1 Jun. 23, 2022

(30) Foreign Application Priority Data

Apr. 4, 2019 (EP) .................................... 19167341

(51) Int. Cl.
*H05G 2/00* (2006.01)
*G03F 7/00* (2006.01)

(52) U.S. Cl.
CPC ......... *H05G 2/008* (2013.01); *G03F 7/70033* (2013.01); *H05G 2/006* (2013.01)

(58) Field of Classification Search
CPC ...... G03F 7/70033; H05G 2/00; H05G 2/008; H05G 2/0082; H05G 2/0084; H05G 2/0088

(Continued)

(56) References Cited

U.S. PATENT DOCUMENTS 7,705,333 B2 4/2010 Komori et al.
8,648,999 B2 2/2014 Graham et al.

(Continued)

FOREIGN PATENT DOCUMENTS

CN 104488362 A 4/2015
CN 105074577 A 11/2015

(Continued)

OTHER PUBLICATIONS

International Search Report and Written Opinion Directed to Related PCT Application No. PCT/EP2020/055514, mailed Jul. 27, 2020; 18 pages.

(Continued)

*Primary Examiner* — Jason L McCormack
(74) *Attorney, Agent, or Firm* — Sterne, Kessler, Goldstein & Fox P.L.L.C.

(57) ABSTRACT

A radiation system configured to produce radiation and comprising a droplet generator (3) configured to produce a droplet of fuel traveling towards a plasma formation region, a laser system operative to generate a pre-pulse (PP) and a main pulse (MP), wherein the pre-pulse is configured to condition the droplet for receipt of the main pulse, and wherein the main pulse is configured to convert the conditioned droplet into plasma producing the radiation and a control system configured to control a spatial offset between the pre-pulse and the droplet in a plane transverse to a propagation direction of the pre-pulse, wherein the control system is configured to adjust the spatial offset so as to (Continued)

maximize a velocity change of the conditioned droplet in a plane transverse to a propagation direction of the main pulse.

14 Claims, 12 Drawing Sheets

(58) Field of Classification Search
USPC .......................................... 250/432 R, 504 R
See application file for complete search history.

(56) References Cited

U.S. PATENT DOCUMENTS

| | | | |
|---|---|---|---|
| 8,663,881 B2 | 3/2014 | Buurman et al. | |
| 8,872,144 B1 | 10/2014 | Fomenkov | |
| 9,000,405 B2 | 4/2015 | Fleurov et al. | |
| 9,588,430 B2 | 3/2017 | van der Burgt et al. | |
| 10,349,509 B2 | 7/2019 | Rafac et al. | |
| 2004/0264512 A1* | 12/2004 | Hartlove ................ | H05G 2/008 372/5 |
| 2008/0149862 A1 | 6/2008 | Hansson et al. | |
| 2013/0077073 A1* | 3/2013 | Van Schoot ........ | G03F 7/70558 355/67 |
| 2013/0321926 A1 | 12/2013 | Bergstedt et al. | |
| 2014/0233005 A1 | 8/2014 | Crouch et al. | |
| 2015/0208494 A1 | 7/2015 | Rafac et al. | |
| 2015/0261095 A1 | 9/2015 | Jansen et al. | |
| 2016/0202614 A1 | 7/2016 | van der Burgt et al. | |
| 2018/0343730 A1 | 11/2018 | Rafac et al. | |
| 2019/0274210 A1* | 9/2019 | Rafac ..................... | H05G 2/008 |
| 2020/0045800 A1* | 2/2020 | Hsu .......................... | G21K 1/06 |

FOREIGN PATENT DOCUMENTS

| | | |
|---|---|---|
| CN | 106094441 A | 11/2016 |
| EP | 2 563 099 A1 | 2/2013 |

OTHER PUBLICATIONS

"Research Disclosure," Research Disclosure, Kenneth Mason Publications, Hampshire, UK, GB, vol. 660, No. 45, Apr. 1, 2019, p. 388, XP007147359; 4 pages.

"Research Disclosure," Research Disclosure, Kenneth Mason Publications, Hampshire, UK, GB, vol. 650, No. 11, Jun. 1, 2018, p. 679, XP007146628; 6 pages.

Sten A. Reijers et al.: "Laser-to-droplet alignment sensitivity relevant for laser-produced plasma sources of extreme ultraviolet light," arxiv.org, Cornell University Library, 201 Olin Library Cornell University Ithaca, NY 14853, May 15, 2018, XP081551523, the whole document; 7 pages.

* cited by examiner

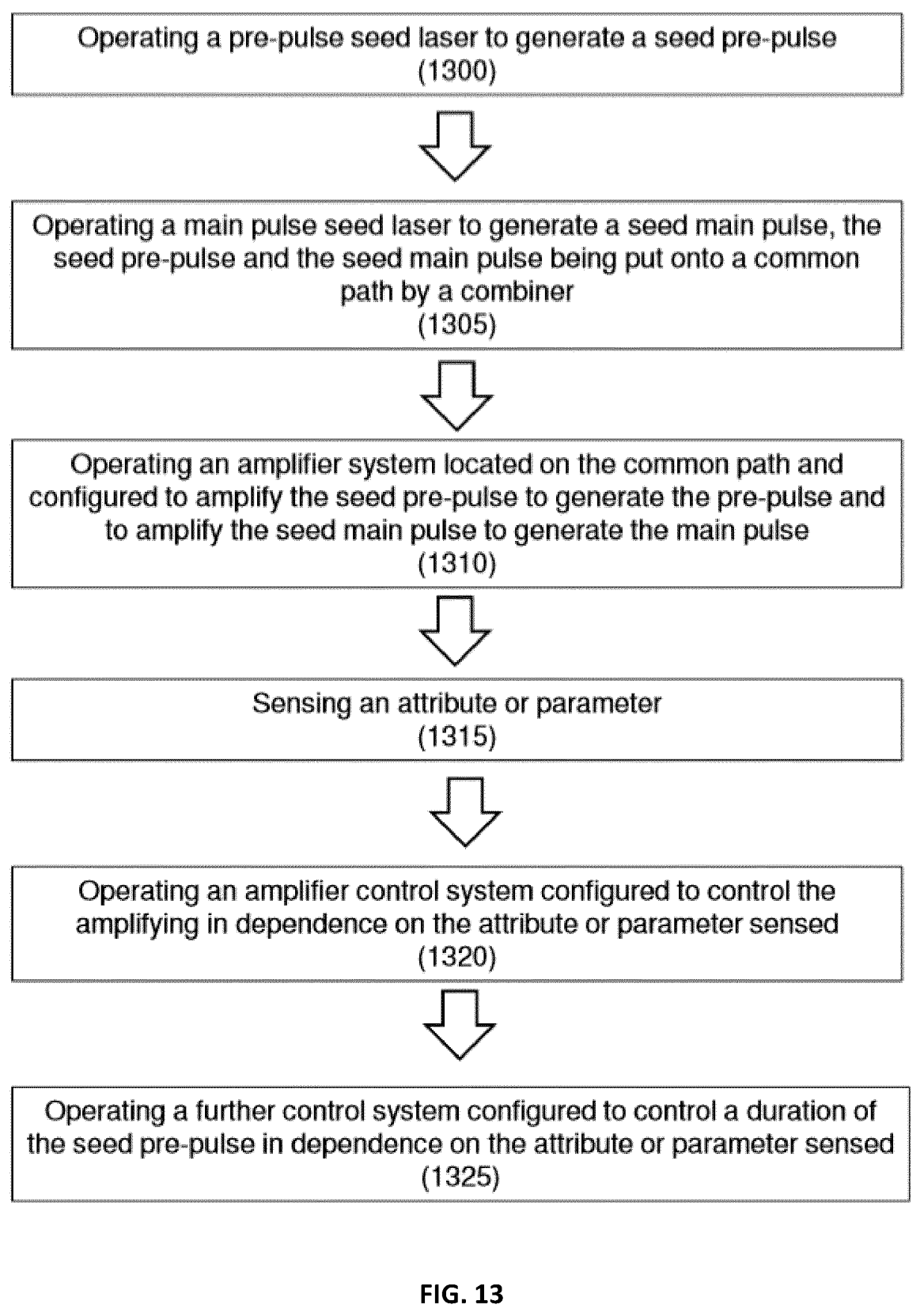

Operating a pre-pulse seed laser to generate a seed pre-pulse
(1300)

Operating a main pulse seed laser to generate a seed main pulse, the seed pre-pulse and the seed main pulse being put onto a common path by a combiner
(1305)

Operating an amplifier system located on the common path and configured to amplify the seed pre-pulse to generate the pre-pulse and to amplify the seed main pulse to generate the main pulse
(1310)

Sensing an attribute or parameter
(1315)

Operating an amplifier control system configured to control the amplifying in dependence on the attribute or parameter sensed
(1320)

Operating a further control system configured to control a duration of the seed pre-pulse in dependence on the attribute or parameter sensed
(1325)

FIG. 13

The attribute or parameter comprising at least one of:
a power of the radiation produced,
the spatial offset, and
a change in the spatial offset
(1400)

Controlling a duration of the pre-pulse to maximize a velocity change of the conditioned droplet in a plane transverse to a propagation direction of the main pulse
(1405)

EUV RADIATION SYSTEM INCLUDING MAXIMIZING DROPLET VELOCITY CHANGE TRANSVERSE TO MAIN PULSE PROPAGATION

CROSS-REFERENCE TO RELATED APPLICATIONS

This application claims priority of EP application 19167341.7 which was filed on Apr. 4, 2019 and which is incorporated herein in its entirety by reference.

FIELD

The present invention relates to a radiation system configured to produce radiation and associated method.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

EUV radiation may be produced by converting a fuel, such as for example tin, into a plasma. One or more droplet(s) of the fuel may be irradiated by one or more laser pulses. For example, each droplet may be may be irradiated by a pre-pulse for conditioning the droplet and a main pulse for converting most or all of the conditioned droplet into plasma, thereby producing EUV radiation.

Stability and/or power of the EUV radiation may depend on a size of the conditioned droplet and/or on a spatial overlap between the conditioned droplet and the main pulse. Variations or changes in the spatial overlap between the conditioned droplet and the main pulse may cause an instability in the produced EUV radiation, reduced power of the EUV radiation and/or variations or errors in the EUV radiation dose.

SUMMARY

According to a first aspect of the invention there is provided a radiation system configured to produce radiation. The radiation system may comprise a droplet generator. The droplet generator may be configured to produce a droplet of fuel traveling towards a plasma formation region. The radiation system may comprise a laser system. The laser system may be operative to generate a pre-pulse and a main pulse. The pre-pulse may be configured to condition the droplet for receipt of the main pulse. The main pulse may be configured to convert the conditioned droplet into plasma producing the radiation. The radiation system may comprise a control system. The control system may be configured to control a spatial offset between the pre-pulse and the droplet in a plane transverse to a propagation direction of the pre-pulse. The control system may be configured to adjust the spatial offset so as to maximize a velocity change of the conditioned droplet in a plane transverse to a propagation direction of the main pulse.

By maximizing the velocity change, a sensitivity of the velocity change to changes in the spatial offset may be reduced or minimized. This may result in an increased or improved stability of a target region, e.g. a region in the plane transverse to the propagation direction of the main pulse, in which the conditioned droplet is converted into plasma producing radiation by the main pulse. This may additionally or alternatively result in an increased or improved spatial overlap between the conditioned droplet and the main pulse, an increase in power of the radiation (e.g. EUV radiation) produced, a decrease in radiation instability (e.g. EUV radiation instability) and/or a decrease in errors or fluctuations in radiation power (e.g. EUV radiation power).

The control system may be configured to adjust a separation between the pre-pulse in the plane transverse to the propagation direction of the pre-pulse and the main pulse in the plane transverse to the propagation direction of the main pulse, for example based on the adjusted spatial offset.

The control system may be configured to adjust a delay time between the generation of the pre-pulse and the generation of the main pulse, e.g. based on the adjusted spatial offset.

By adjusting the separation between the pre-pulse in the plane transverse to the propagation direction of the pre-pulse and the main pulse in the plane transverse to the propagation direction of the main pulse and/or the delay time between the generation of the pre-pulse and the generation of the main pulse, e.g. based on the adjusted spatial offset, the spatial overlap between the conditioned droplet and the main pulse may be increased or improved. This in turn may result in an increase of radiation power (e.g. EUV radiation power), increased radiation stability (e.g. EUV radiation stability) and/or a decrease in errors or fluctuations in radiation power (e.g. EUV radiation power).

The laser system may be configured to direct the main pulse towards a target region. The conditioned droplet may be converted into plasma producing radiation at the target region.

The control system may be configured to adjust the target region in dependence on at least one of: the adjusted spatial offset, the velocity change, a separation between the pre-pulse in the plane transverse to the propagation direction of the pre-pulse and the main pulse in the plane transverse to the propagation direction of the main pulse, and a delay time between the generation of the pre-pulse and the generation of the main pulse.

The control system may be configured to adjust the spatial offset so as to maximize the velocity change in dependence on one or more parameter(s).

The one or more parameter(s) may comprise a duration of the pre-pulse and/or an energy of the pre-pulse.

The one or more parameter(s) may comprise at least one of: a position of the droplet in the plane transverse to the propagation direction of the pre-pulse, a position of the pre-pulse in the plane transverse to the propagation direction of the pre-pulse, a change in the position of the droplet in the plane transverse to the propagation direction of the pre-pulse, a change in the position of the pre-pulse in the plane transverse to the propagation direction of the pre-pulse, a position of the main pulse in the plane transverse to the propagation direction of the main pulse, and a change in the position of the main pulse in the plane transverse to the propagation direction of the main pulse.

The radiation system may comprise a sensor system. The sensor system may be configured to sense at least one parameter of the one or more parameter(s).

The control system may be configured to control and/or adjust the spatial offset in dependence on the at least one sensed parameter of the one or more parameter(s).

The adjusted spatial offset may be between about 20 μm to 25 μm.

The radiation system may comprise a/the sensor system. The sensor system may be configured to sense an attribute or parameter. The laser system may comprise a pre-pulse seed laser configured to generate a seed pre-pulse. The laser system may comprise a main pulse seed laser configured to generate a seed main pulse. The laser system may comprise a combiner configured to put the seed pre-pulse and the seed main pulse onto a common path. The laser system may comprise an amplifier system. The amplifier system may be located on the common path. The amplifier system may be configured to amplify the seed pre-pulse to generate the pre-pulse and to amplify the seed main pulse to generate the main pulse. The laser system may comprise an amplifier control system. The amplifier control system may be configured to control the amplifying in dependence on the attribute or parameter sensed. The laser system may comprise a further control system. The further control system may be configured to control a/the duration of the seed pre-pulse in dependence on the attribute or parameter sensed.

By controlling the duration of the seed pre-pulse in dependence on the sensed attribute or parameter, a variation or change in the spatial offset between the pre-pulse and the droplet and/or velocity change may be reduced or compensated. This may reduce or avoid a variation or change in the spatial overlap between the conditioned droplet and the main pulse, thereby reducing or preventing a decrease in the power of the produced radiation (e.g. EUV radiation), radiation instability (e.g. EUV radiation instability) and/or errors or fluctuations in radiation power (e.g. EUV radiation power).

The attribute or parameter may comprise an attribute or parameter of the radiation produced.

The attribute or parameter may comprise at least one of: a power of the radiation produced, the spatial offset, and a change in the spatial offset.

The further control system may be configured to adjust the duration of the seed pre-pulse laser so that the velocity change is substantially unchanged or constant (or unchanged or constant), e.g. when the seed pre-pulse and seed main pulse are amplified in dependence on the attribute or parameter sensed.

The control system may be operative to maximize the velocity change through control of a/the duration of the pre-pulse.

By maximizing the velocity change, a sensitivity of the velocity change to changes in the spatial offset may be reduced or minimized. This may result in an increased or improved stability of a target region, e.g. a region in the plane transverse to the propagation direction of the main pulse, in which the conditioned droplet is converted into plasma producing radiation by the main pulse. This may additionally or alternatively result in an increased or improved spatial overlap between the conditioned droplet and the main pulse, an increase in power of the radiation (e.g. EUV radiation) produced, a decrease in radiation instability (e.g. EUV radiation instability) and/or a decrease in errors or fluctuations in radiation power (e.g. EUV radiation power).

The control system may be operative to adjust a/the duration of the pre-pulse in response to a change of energy of the pre-pulse.

The control system may be operative to adjust a/the duration of the pre-pulse based on a separation or distance between the pre-pulse in the plane transverse to the propagation direction of the pre-pulse and the main pulse in the plane transverse to the propagation direction of the main pulse.

The control system may be operative to adjust the duration of the pre-pulse in response to a change in a separation or distance between the pre-pulse in the plane transverse to the propagation direction of the pre-pulse and the main pulse in the plane transverse to the propagation direction of the main pulse.

According to a second aspect of the invention there is provided a radiation system. The radiation system may be configured to produce radiation. The radiation system may comprise a droplet generator. The droplet generator may be configured to produce a droplet of fuel traveling towards a plasma formation region. The radiation system may comprise a laser system. The laser system may be operative to generate a pre-pulse and a main pulse. The pre-pulse may be configured to condition the droplet for receipt of the main pulse. The main pulse may be configured to convert the conditioned droplet into plasma producing the radiation. The radiation system may comprise a sensor system. The sensor system may be configured to sense a parameter or attribute. The laser system may comprise a pre-pulse seed laser configured to generate a seed pre-pulse. The laser system may comprise a main pulse seed laser configured to generate a seed main pulse. The laser system may comprise a combiner configured to put the seed pre-pulse and the seed main pulse onto a common path. The laser system may comprise an amplifier system. The amplifier system may be located on the common path. The amplifier system may be configured to amplify the seed pre-pulse to generate the pre-pulse and to amplify the seed main pulse to generate the main pulse. The laser system may comprise an amplifier control system. The amplifier control system may be configured to control the amplifying in dependence on the attribute or parameter sensed. The laser system may comprise a further control system. The further control system may be configured to control a duration of the seed pre-pulse in dependence on the attribute or parameter sensed. The attribute or parameter sensed may comprise at least one of: a power of the radiation produced, a spatial offset between the pre-pulse and the droplet in a plane transverse to a propagation direction of the pre-pulse and a change in the spatial offset.

By controlling the duration of the seed pre-pulse in dependence on the sensed attribute or parameter, a variation or change in the spatial offset between the pre-pulse and the droplet and/or velocity change may be reduced or compensated. This may reduce or avoid a variation or change in the spatial overlap between the conditioned droplet and the main pulse, thereby reducing or preventing a decrease in the power of the produced radiation (e.g. EUV radiation), radiation instability (e.g. EUV radiation instability) and/or errors or fluctuations in radiation power (e.g. EUV radiation power).

The radiation system of the second aspect may comprise any features of the radiation system of the first aspect.

According to a third aspect of the present invention there is provided a radiation system. The radiation system may be configured to produce radiation. The radiation system may comprise a droplet generator. The droplet generator may be configured to produce a droplet of fuel traveling towards a plasma formation region. The radiation system may comprise a laser system. The laser system may be operative to generate a pre-pulse and a main pulse. The pre-pulse may be configured to condition the droplet for receipt of the main pulse. The main pulse may be configured to convert the conditioned droplet into plasma producing the radiation. The radiation system may comprise a control system. The control system may be configured to or be operative to adjust, control and/or maximize a velocity change of the conditioned droplet in a plane transverse to a propagation direction of the main pulse through control of a duration of the pre-pulse.

By adjusting, controlling and/or maximizing a velocity change of the conditioned droplet in a plane transverse to a propagation direction of the main pulse through control of a duration of the pre-pulse, the spatial overlap between the conditioned droplet and the main pulse in the plane transverse to a propagation direction of the main pulse may be optimized or maximized. This may result in an increase in the power of the radiation produced (e.g. EUV radiation produced), increased radiation stability (e.g. EUV radiation stability) and/or a decrease in errors or fluctuations in radiation power (e.g. EUV radiation power).

The radiation system of the third aspect may comprise any features of the radiation system of the first aspect and/or the second aspect.

According to a fourth aspect there is provided a lithographic system comprising the radiation system of the first, second and/or third aspect.

According to a fifth aspect there is provided a method of producing radiation. The method may comprise operating a droplet generator to produce a droplet of fuel traveling towards a plasma formation region. The method may comprise operating a laser system to generate a pre-pulse for conditioning the droplet. The method may comprise controlling a spatial offset between the pre-pulse and the droplet in a plane transverse to a propagation direction of the pre-pulse. The method may comprise adjusting the spatial offset so as to maximize a velocity change of the conditioned droplet in a plane transverse to a propagation direction of a main pulse. The method may comprise operating the laser system to generate the main pulse for converting the conditioned droplet into plasma producing radiation.

The method may comprise operating a pre-pulse seed laser to generate a seed pre-pulse. The method may comprise operating a main pulse seed laser to generate a seed main pulse. The pre-pulse seed laser and the main pulse seed laser may be part of or comprised in the laser system. The seed pre-pulse and the seed main pulse may be put onto a common path by a combiner. The method may comprise operating an amplifier system. The amplifier system may be located on the common path. The amplifier system may be configured to amplify the seed pre-pulse to generate the pre-pulse and to amplify the seed main pulse to generate the main pulse. The method may comprise sensing an attribute or parameter. The method may comprise operating an amplifier control system. The amplifier control system may be configured to control the amplifying in dependence on the attribute or parameter sensed. The method may comprise operating a further control system. The further control system may be configured to control a duration of the seed pre-pulse in dependence on the attribute or parameter sensed.

The attribute or parameter may comprise at least one of: a power of the radiation produced, the spatial offset, and a change in the spatial offset.

The method may comprise controlling a duration of the pre-pulse to maximize the velocity change.

According to a sixth aspect of the present invention there is provided a computer program. The computer program may comprise computer readable instructions configured to cause a processor to carry out a method according to the fifth aspect.

According to a seventh aspect of the present invention there is provided a computer readable medium carrying a computer program according to sixth aspect.

According to an eight aspect there is provided a computer apparatus comprising a memory storing processor readable instructions; and a processor arranged to read and execute instructions stored in said memory. The processor readable instructions may comprise instructions arranged to control the computer to carry out a method according to the fifth aspect.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings, in which:

FIG. 13 depicts a flowchart of method steps, which may be part of or comprised in the method depicted in FIG. 12.

DETAILED DESCRIPTION

Figure 1:
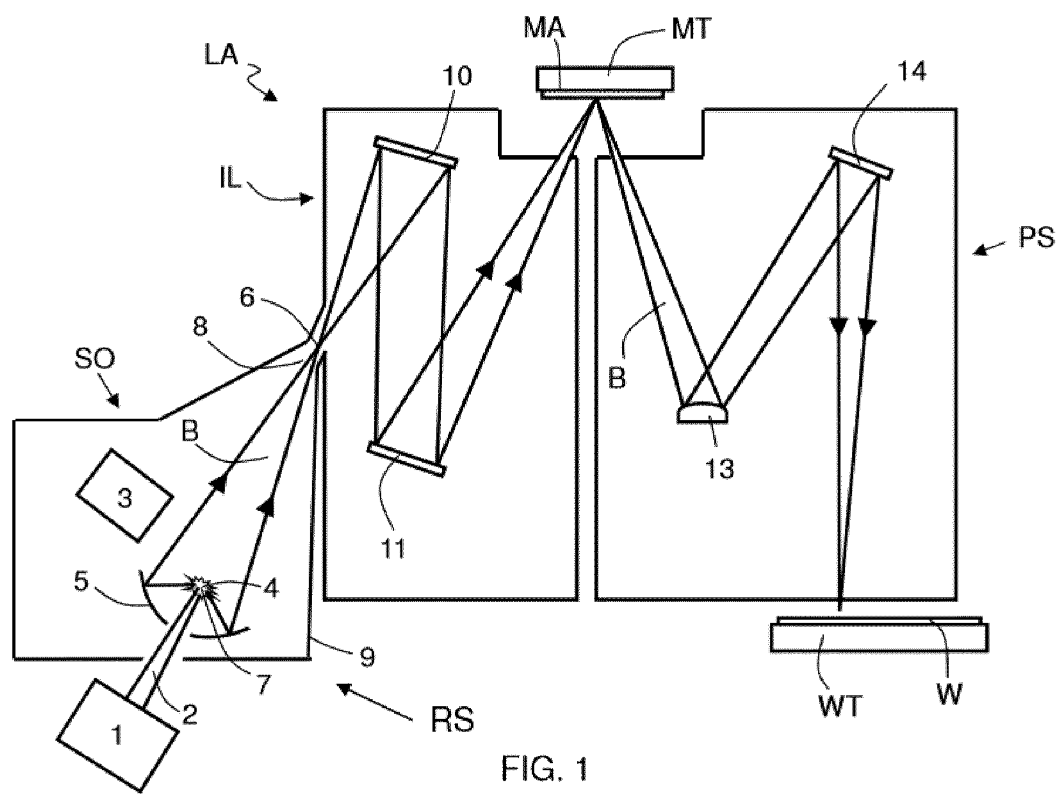
FIG. 1 depicts a lithographic system comprising a lithographic apparatus and a radiation system according to an embodiment of the invention.

FIG. 1 shows a lithographic system including a radiation system RS. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser system 1, which may comprise for example a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may be provided in the form of a droplet generator 3. The droplet generator 3 may be configured to produce a droplet D (not shown in FIG. 1) of fuel travelling towards a plasma formation region 4. For example, the droplet generator 3 may comprise a nozzle configured to direct tin, e.g. in the form of droplets D, along a trajectory towards the plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal-incidence radiation collector 5 (sometimes referred to more generally as a normal-incidence radiation collector). The collector 5 may have a multilayer structure which is arranged to reflect EUV radiation (e.g. EUV radiation having a desired wavelength such as 13.5 nm). The collector 5 may have an ellipsoidal configuration, having two focal points. A first focal point may be at the plasma formation region 4, and a second focal point may be at an intermediate focus 6, as discussed below.

The laser system 1 may be remote from the radiation source SO. Where this is the case, the laser beam 2 may be passed from the laser system 1 to the radiation source SO with the aid of a beam delivery system 1*a* (depicted in FIG. 2) comprising, for example, suitable directing mirrors and/or a beam expander, and/or other optics. The laser system 1, the beam delivery system 1*a* and the radiation source SO may together be considered to be a radiation system RS. In other words, the laser system 1 and/or beam delivery system 1*a* may be part of or comprised in the radiation system RS. The radiation system RS may be configured to produce radiation, e.g. EUV radiation, as described above. The beam delivery system 1*a* may be part of or comprised in the laser system 1.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular intensity distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

Figure 2:
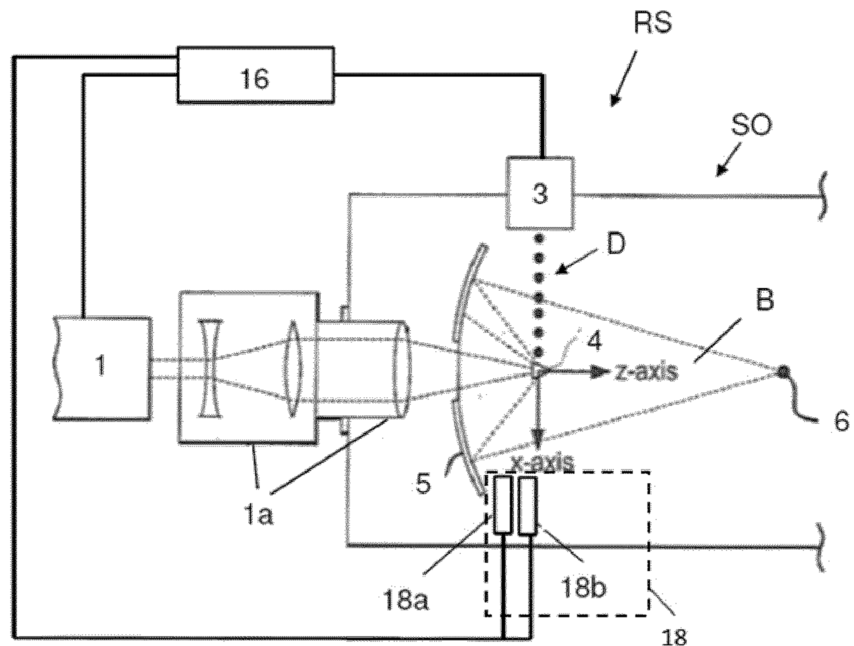
FIG. 2 depicts a radiation system for use in the lithographic system of FIG. 1.

FIG. 2 shows a radiation system for use in a lithographic system, such as for example the lithographic system shown in FIG. 1. The radiation system RS shown in FIG. 2 may comprise any of the features of the radiation system RS shown in FIG. 1. For example, the radiation system shown in FIG. 2 may comprise the droplet generator 3 described above in relation to FIG. 1.

Figure 3:
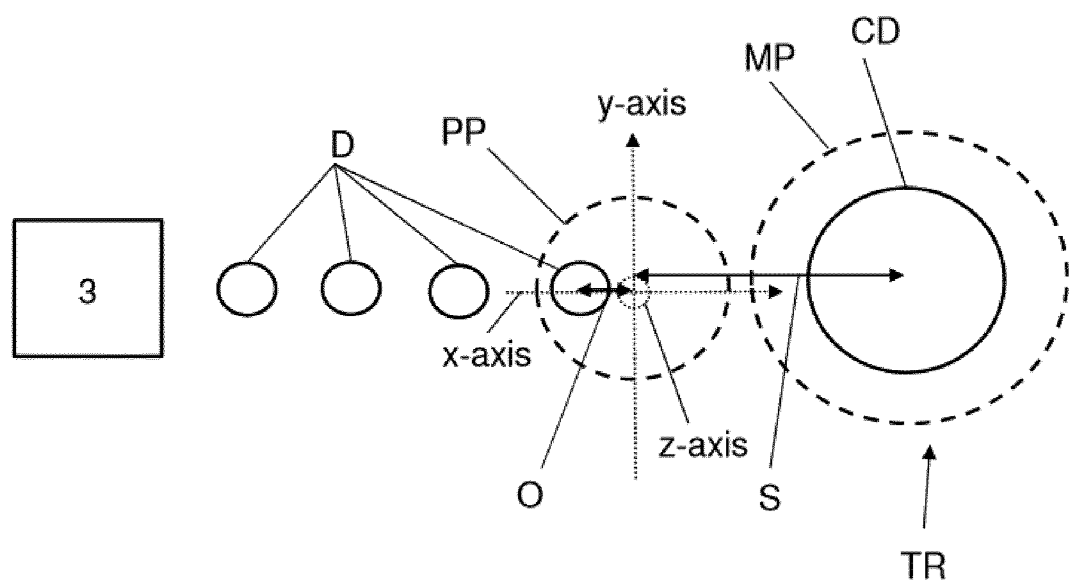
FIG. 3 schematically depicts the interaction between fuel droplets produced by a droplet generator and a pre-pulse and a main pulse generated by a laser system of the radiation system of FIGS. 1 and 2.

Referring to FIGS. 2 to 3, the laser system 1 is operative to generate a pre-pulse PP and a main pulse MP. The pre-pulse PP is configured to condition the droplet D for receipt of the main pulse MP. In other words, the pre-pulse PP may be configured to heat, deform, expand, gasify, vaporize and/or ionize the droplet D and/or to generate a weak plasma. For example, as shown in FIG. 3, the pre-pulse PP may be configured to deform the spherical droplet D so that its shape is closer to a disk (such as a pancake shape), when it is being hit by the main pulse MP. It will be appreciated that in other embodiments the pre-pulse may be configured to deform the droplet D into a different shape. The conditioned droplet is indicated in FIG. 3 by the label "CD".

The main pulse MP is configured to convert the conditioned droplet CD into plasma producing the EUV radiation. In other words, the main pulse MP may be configured to convert most or all of the conditioned droplet CD into plasma, thereby producing the EUV radiation.

The radiation system RS may comprise a control system 16 (shown in FIG. 2). The control system 16 may be configured to control a spatial offset O between the pre-pulse PP and the droplet D in a plane transverse to a propagation direction of the pre-pulse PP. The control system 16 may be configured to adjust the spatial offset O so as to maximize a change in velocity of the conditioned droplet CD, relative to the initial velocity of the unconditioned droplet D, in a plane transverse to a propagation direction of the main pulse MP. The velocity change of the conditioned droplet is due to the transfer of momentum of the pre-pulse PP to the unconditioned droplet D. The control system 16 may be provided in the form of a computing device. The control system 16 may be configured to communicate with other components or parts of the radiation system RS, such as for example the laser system 1, the beam delivery system 1*a* and/or the droplet generator 3.

The feature "plane transverse to the propagation direction of the pre-pulse PP" may be considered as encompassing a plane extending in the directions indicated by the x-axis and y-axis in FIG. 3, which will be referred to in the following description as the first x-y-plane.

The feature "propagation direction of the pre-pulse PP" may be considered as encompassing a direction parallel to (e.g. substantially parallel to) or along the z-axis indicated in FIGS. 2 and 3.

The feature "plane transverse to the propagation direction of the main pulse MP" may be considered as encompassing a plane extending in the directions indicated by the x-axis and y-axis in FIG. 3, which will be referred to in the following description as the second x-y-plane. It will be appreciated that the first x-y-plane may be offset in the direction of the z-axis relative to the second x-y-plane. This offset may be a result of an offset between a focus point of the pre-pulse PP relative to the main pulse MP in the direction of the z-axis indicated in FIGS. 2 and 3.

The feature "propagation direction of the main pulse MP" may be considered as encompassing a direction parallel to (e.g. substantially parallel to) or along the z-axis indicated in FIG. 2. The propagation direction of the main pulse MP may be offset in the direction of the x-axis, as indicated in FIG. 2.

In the following description, a direction indicated by the x-axis in FIGS. 2 and 3 will be referred to as the x-direction, a direction indicated by the y-axis in FIG. 3 will be referred to as the y-direction and a direction indicated by the z-axis in FIGS. 2 and 3 will be referred to as the z-direction.

The feature "spatial offset" may be considered a vector lying in the first x-y plane and having a magnitude representative of a distance or separation between the droplet D, e.g. a center of the droplet D, and the pre-pulse PP, e.g. a center of the pre-pulse PP. For example, the feature "spatial offset" may be considered as encompassing a distance or separation between the droplet D, e.g. the center of the droplet D, and the pre-pulse PP, e.g. the center of the pre-pulse PP, in the first x-y plane.

The spatial offset may comprise an x-component and/or a y-component. In other words, the droplet D, e.g. the center of the droplet, may be shifted relative to or separated from the pre-pulse PP, e.g. the center of the pre-pulse PP, in the x-direction and/or y-direction.

It will be appreciated that in some embodiments the spatial offset may comprise a z-component. In other words, the droplet D, e.g. the center of the droplet D, may be shifted relative to or separated from the pre-pulse, e.g. the center of the pre-pulse PP, in the z-direction.

The spatial offset may be zero or substantially zero, e.g. if the center of the droplet D overlaps, e.g. substantially overlaps, with the center of the pre-pulse PP.

It will be appreciated that the velocity change may occur in the x-direction, y-direction or z-direction or combinations thereof. Accordingly, the velocity change is a vector as well.

For completeness, it is remarked here that, throughout this text, physical quantities, which are vectors, are represented in bold characters, and that physical quantities, which are scalars, are represented in normal characters. For example, the spatial offset O is a vector, i.e., a physical quantity having a direction as well as a magnitude, and is therefore indicated with a bold character. As another example, both the magnitude of the spatial offset O and the x-component of the spatial offset are scalars.

In FIG. 3 the spatial offset O comprises a non-zero x-component whereas the y-component is substantially zero. It will be appreciated that in other embodiments, the spatial offset may comprise an x-component and a y-component, as described above. Alternatively, the spatial offset may comprise a y-component and the x-component may be substantially zero.

The velocity change may be proportional to the change in momentum Δp, which is also a vector:

$$\Delta p = mv_{final} - mv_{initial}$$

where the mass m of the droplet may be considered to be constant or unchanged during the interaction between the droplet D and the pre-pulse PP. The velocity change may be considered as the difference between a velocity of the droplet D produced by the droplet generator 3, e.g. $v_{initial}$, and a velocity of the conditioned droplet CD $v_{final}$. In other words, the velocity change Δv is equal to:

$$\Delta v = v_{final} - v_{initial}$$

where the change in momentum Δp and the velocity change Δv are vectors.

Figure 4A:
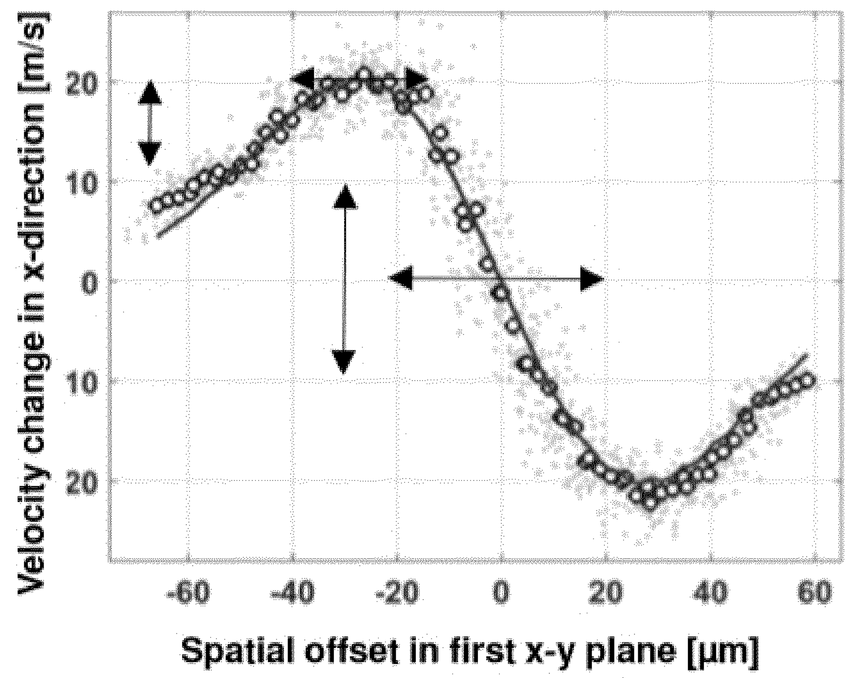
FIG. 4A depicts a graph of a velocity change in the x-direction in dependence on a spatial offset between a droplet of fuel and the pre-pulse in a first x-y-plane.

FIG. 4A depicts a graph of the velocity change Δv in the x-direction in dependence on the spatial offset between the droplet D and the pre-pulse PP in the first x-y-plane. The velocity change Δv in the x-direction is a scalar, and is denoted as $\Delta v_x$. The light grey dots in FIG. 4A represent measured values of the velocity change $\Delta v_x$, the open circles represent average values of the velocity change $\Delta v_x$ and the solid line represents a curve fitted to the average values of the velocity change $\Delta v_x$. If the magnitude of the velocity change is maximized, e.g. if a magnitude of the spatial offset is between about 20 μm and 25 μm, a variation $6\Delta v_x$ of the velocity change in the x-direction $\Delta v_x$ associated with a variation in the spatial offset is minimized (indicated in FIG. 4A by the arrows). Please note that the magnitude of the spatial offset and the magnitude of the velocity change refer to absolute numerical values, without the polarity sign. FIG. 4A illustrates that the largest changes of the magnitude of the velocity in the x-direction occur for spatial offsets in the range of (about) 20 μm to 25 μm and in the range of (about) −20 μm to −25 μm. The variation of the x-component of the velocity change Δv, expressed as $\Delta v_x$, in dependence on a variation of the spatial offset O may be expressed as a gradient G that is zero at the maximum of $\Delta v_x$:

$$\frac{\delta \Delta v_x}{\delta O} \approx 0$$

where O is the spatial offset in the first x-y-plane. A sensitivity of the velocity change Δv to variations or changes in the spatial offset may be minimal, if the magnitude of the velocity change Δv is maximized. In other words, the gradient G may be minimal or zero, e.g. substantially zero, if the magnitude of the velocity change Δv is maximized, e.g. at about 25 μm and about −25 μm.

As shown in FIG. 4A (and indicated by the arrows), for example if the velocity change Δv in the x-direction is about zero, a variation or change of the spatial offset O may result in a maximum variation of change in the velocity Δv in the x-direction. In other words, the gradient G may be maximal, if the magnitude of the spatial offset O is about zero. On the other hand, for example if the velocity change Δv is maximized, a variation or change in the spatial offset O may result in a minimal or reduced variation of the velocity change Δv in the x-direction.

By maximizing the velocity change, the sensitivity of the velocity change to changes in the spatial offset may be minimized. This may result in an increased or improved stability of a target region TR, e.g. a region in the second x-y-plane in which the conditioned droplet CD is converted into plasma by the main pulse MP. This may additionally or alternatively result in an increased or improved spatial overlap between the conditioned droplet CD and the main pulse MP, an increase in power of the EUV radiation produced, a decrease in EUV radiation instability and/or a decrease in errors or fluctuations in EUV radiation power.

Figure 4B:
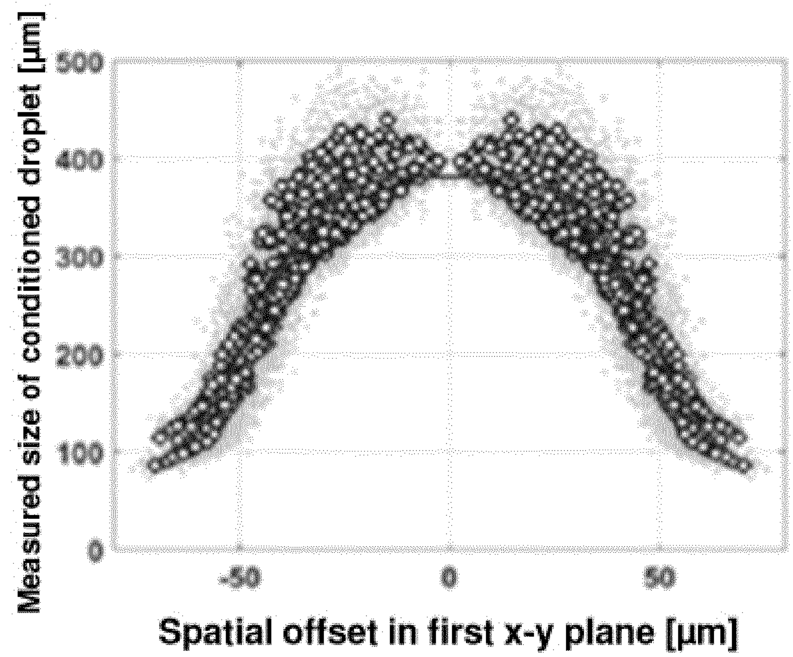
FIG. 4B depicts a graph of a measured size of the conditioned droplet in dependence on the spatial offset between a droplet of fuel and the pre-pulse in the x-y-plane.

FIG. 4B shows a graph of the measured size of the conditioned droplet CD in dependence on the magnitude of the spatial offset O between the droplet D and the pre-pulse PP in the first x-y-plane. As described above, the pre-pulse PP may be configured, for example to expand the droplet D. In FIG. 4B, the size of the conditioned droplet CD was measured at, e.g., about 3 μs after the start of the pre-pulse PP hitting the droplet D. The light grey dots in FIG. 4B represent measured values of the size of the conditioned droplet CD, the open circles represent average values of the measured sizes of the conditioned droplet CD and the solid line represents a curve fitted to the average values of the measured sizes of the conditioned droplet CD. It can be seen from FIG. 4B that the size of the conditioned droplet CD is dependent on the spatial offset O between the droplet D and the pre-pulse PP. For a spatial offset O having a magnitude larger than about 25 μm (or smaller than about −25 μm), the size of the conditioned droplet CD may decrease. This may be due to the spatial overlap between the droplet D and the pre-pulse PP decreasing with increasing magnitude of the spatial offset O. The size of the conditioned droplet CD may be considered to be maximized for a magnitude of the spatial offset O in the range of about −25 μm to 25 μm. Although FIG. 4B shows a spread of the measured sizes and average sizes of the conditioned droplet in this range, the size of the conditioned droplet CD may be considered to be largely independent of, or unchanged for, a magnitude of the spatial offset O in the range of about −25 μm to 25 μm. In other words, a variation of the size of the conditioned droplet CD may be considered to be reduced for a spatial offset with a magnitude in the range of about −25 μm to 25 μm. This may result in an improved spatial overlap between the conditioned droplet CD and the main pulse MP.

Referring back to FIG. 2, the control system 16 may be configured to adjust the spatial offset O, for example, by adjusting a relative position between the droplet D and the pre-pulse PP. For example, the control system 16 may be configured to communicate with the droplet generator 3. The droplet generator 3 may be configured to release a droplet D in response to a signal from the control system 16. Alternatively, or in combination with the preceding adjustment option, the droplet generator 3 may be configured to slightly change a direction of the trajectory of the droplets in response to the signal from the control system 16. The control system 16 may be configured communicate with the laser system 1 and/or the beam delivery system 1*a*. For example, the control system 16 may be configured to transmit a signal to the laser system 1 and/or the beam delivery system 1*a*. In response to the signal transmitted by the control system 16, the laser system 1 and/or beam delivery system 1*a* may be configured to set or adjust a position, timing, shape and/or power of the pre-pulse PP in the first x-y-plane and/or main pulse MP in the second x-y-plane. This may allow the control system 16 to adjust the spatial offset O between the droplet D and the pre-pulse PP.

The control system 16 may be configured to set the spatial offset O, e.g. so that the velocity change of the conditioned droplet CD with respect to the velocity of the unconditioned droplet D is maximized in the second x-y-plane. The control system 16 may be configured to maintain the spatial offset O, e.g. the set spatial offset, for example, by adjusting a relative position between the pre-pulse PP and the droplet D, as described above.

The control system 16 may be configured to adjust a separation or distance S (which is indicated in FIG. 3) between the pre-pulse PP in the first x-y-plane and the main pulse MP in the second x-y-plane, based on the adjusted spatial offset. For example, during maintenance and/or calibration operations of the lithographic system or parts thereof, the position of the droplet D relative to the pre-pulse PP may be adjusted so that the magnitude of the spatial offset O is zero, e.g. the center of the droplet overlaps, e.g. substantially overlaps, the center of the pre-pulse PP. Subsequently, the control system 16 may be configured to adjust the spatial offset so as to maximize the magnitude of the velocity change Δv of the conditioned droplet CD in the second x-y-plane, as described above. Based on the adjusted spatial offset, the control system 16 may be configured to adjust the separation or distance S between the pre-pulse PP in the first x-y-plane and the main pulse MP in the second x-y-plane, for example to optimize or maximize the spatial overlap between the conditioned droplet CD and the main pulse MP.

The control system 16 may be operative to transmit a signal to the laser system 1 and/or the beam delivery system 1*a*. In response to the signal transmitted by the control system 16, the laser system 1 and/or the beam delivery system 1*a* may be operative to adjust a relative position between the pre-pulse PP in the first x-y-plane and the main pulse MP in the second x-y-plane so as to adjust the separation or distance S between the pre-pulse PP and the main pulse MP.

The control system 16 may be configured to adjust a delay time, e.g. a time between the generation of the pre-pulse PP and the main pulse MP, between the generation of the pre-pulse and the generation of the main pulse MP, based on the adjusted spatial offset O. For example, the control system 16 may be operative to transmit a signal to the laser system 1 and/or beam delivery system 1*a*. In response to the signal transmitted by the control system 16, the laser system 1 and/or beam delivery system 1*a* may adjust the time between the generation of the pre-pulse PP and the generation of the main pulse MP.

By adjusting the separation or distance S and/or the delay time between the pre-pulse PP in the first x-y-plane and the main pulse MP in the second x-y-plane, based on the adjusted spatial offset, the spatial overlap between the conditioned droplet CD and the main pulse MP may be optimized or maximized. This in turn may result in an increase in EUV radiation power, increased EUV radiation stability and/or a decrease in errors or fluctuations in EUV radiation power.

The laser system 1 and/or the beam delivery system 1*a* may be configured to direct the main pulse MP towards the target region TR. The control system 16 may configured to adjust the target region TR. For example, the control system 16 may be configured to adjust the target region TR in dependence on at least one of the adjusted spatial offset O, the velocity change Δv, a separation S between the pre-pulse PP in the first x-y-plane and the main pulse MP in the second x-y-plane and the delay time between the generation of the pre-pulse and the generation of the main pulse MP. In other words, the position of the conditioned droplet CD relative to the main pulse MP may be adjusted or tuned (or be adjustable or tunable) by adjusting at least one of the spatial offset O, the velocity change Δv, a separation S between the pre-pulse PP in the first x-y-plane and the main pulse MP in the second x-y-plane and the delay time between the generation of the pre-pulse PP and the generation of the main pulse MP. The control system 16 may be operative to transmit a signal to the laser system 1 and/or the beam delivery system 1*a*. In response to the signal the laser system 1 and/or the beam delivery system 1*a* may direct the main pulse MP to the adjusted target region TR.

The spatial overlap between the conditioned droplet CD and the main pulse MP may be determined or dependent on the separation S between the pre-pulse PP in the first x-y-plane and the main pulse MP in the second x-y-plane, the delay time between the generation of the pre-pulse PP and the generation of the main pulse MP and/or a trajectory of the conditioned droplet CD. The trajectory of the conditioned droplet CD may be determined by the spatial offset O and/or the velocity change Δv. Therefore, by adjusting one or all of the separation S between the pre-pulse PP in the first x-y-plane and the main pulse MP in the second x-y-plane, the delay time between the generation of the pre-pulse and the generation of the main pulse MP and the trajectory of the conditioned droplet CD, the spatial overlap between the conditioned droplet CD and the main pulse MP may be optimized or maximized. This may result in an increase in the power of the EUV radiation produced, increased EUV radiation stability and/or a decrease in errors or fluctuations in EUV radiation power.

The control system 16 may be configured to adjust the spatial offset O so as to maximize the magnitude of the velocity change Δv under control of one or more parameter(s). For example, the one or more parameter(s) may comprise a duration of the pre-pulse PP and/or an energy of the pre-pulse PP. As will be described in more detail below, the velocity change Δv may be varied by varying or adjusting the duration of the pre-pulse PP and/or the energy of the pre-pulse PP.

The one or more parameter(s) may comprise at least one of: a position of the droplet in the first x-y-plane, a position of the pre-pulse PP in the first x-y-plane, a change in the position of the droplet D in the first x-y-plane, a change in the position of the pre-pulse in the first x-y-plane, a position of the main pulse in the second x-y-plane and a change in the position of the main pulse in the second x-y-plane.

The radiation system RS may comprise a sensor system 18. The sensor system 18 may be configured to sense at least one parameter of the one or more parameter(s). The sensor system 18 may comprise a first sensor 18*a*. The first sensor 18*a* may be provided in the form of, e.g., a quadcell that comprises an arrangement of four photodiodes behind a pinhole or the like. The first sensor 18*a* may be configured to sense a position of the pre-pulse PP in the x-y plane. As mentioned earlier, the pre-pulse PP may comprising a wavelength of 10.6 μm, 10.26 μm, 10.207 μm and/or 1 μm. A part of the sensor system 18, e.g. the first sensor 18*a*, may be provided or comprised in a focal volume measurement unit (not shown) of the radiation system RS.

The sensor system 18 may be operative to sense a position of the droplet D in the first x-y-plane and/or a position of the conditioned droplet CD in the second x-y-plane. For example, the first sensor 18*a* may be operative and/or arranged to sense the pre-pulse PP (or a portion thereof) and/or at least a portion of the pre-pulse PP that is reflected from the droplet D, e.g. subsequent to conditioning of the droplet by the pre-pulse PP. The sensed pre-pulse PP (or portion thereof) and/or the sensed reflected portion of the pre-pulse PP may be used to determine a position of the droplet D in the first x-y-plane, e.g. a position of the droplet D relative to the pre-pulse PP in the first x-y-plane, and/or a position of the conditioned droplet CD in the second x-y-plane. Additionally or alternatively, the sensed pre-pulse PP (or portion thereof) and/or the sensed reflected portion of the pre-pulse PP may be used to determine a change in a position of the pre-pulse PP and/or the droplet in the first x-y-plane. For example, a change in the intensity of the sensed pre-pulse PP (or a portion thereof) and/or the sensed reflected portion of the pre-pulse PP across the first sensor 18*a* may be used to determine the change in the position of the pre-pulse PP and/or the droplet D in the first x-y-plane. For more background information on the alignment of the laser pulses (pre-pulse PP and main pulse MP) and other metrology aspects, see, e.g., U.S. Pat. No. 9,000,405, issued to Fleurov at al., assigned to ASML and incorporated herein by reference; U.S. Pat. No. 8,872,144, issued to Fomenkov, assigned to ASML and incorporated herein by reference; U.S. Pat. No. 8,648,999 issued to Graham et al., assigned to Cymer, a subsidiary of ASML, and incorporated herein by reference.

Additionally or alternatively, the sensor system 18 may comprise a second sensor 18*b*. The second sensor 18*b* may be operative to sense the duration and/or energy of the pre-pulse PP. The second sensor 18*b* may be provided in the form of a photoelectromagnetic sensor.

The control system 16 may be configured to determine the spatial offset O between the droplet D and the pre-pulse PP based on the at least one sensed parameter of the one or more parameter(s). The control system 16 may be configured to control and/or adjust the spatial offset O in dependence on the at least one sensed parameter of the one or more parameter(s). For example, the sensor system 18 may be configured to communicate with the control system 16. The sensor system 18 may be configured to transmit a signal to the control system 16. The signal may be indicative of at least one of or all of the one or more parameter(s).

Figure 5:
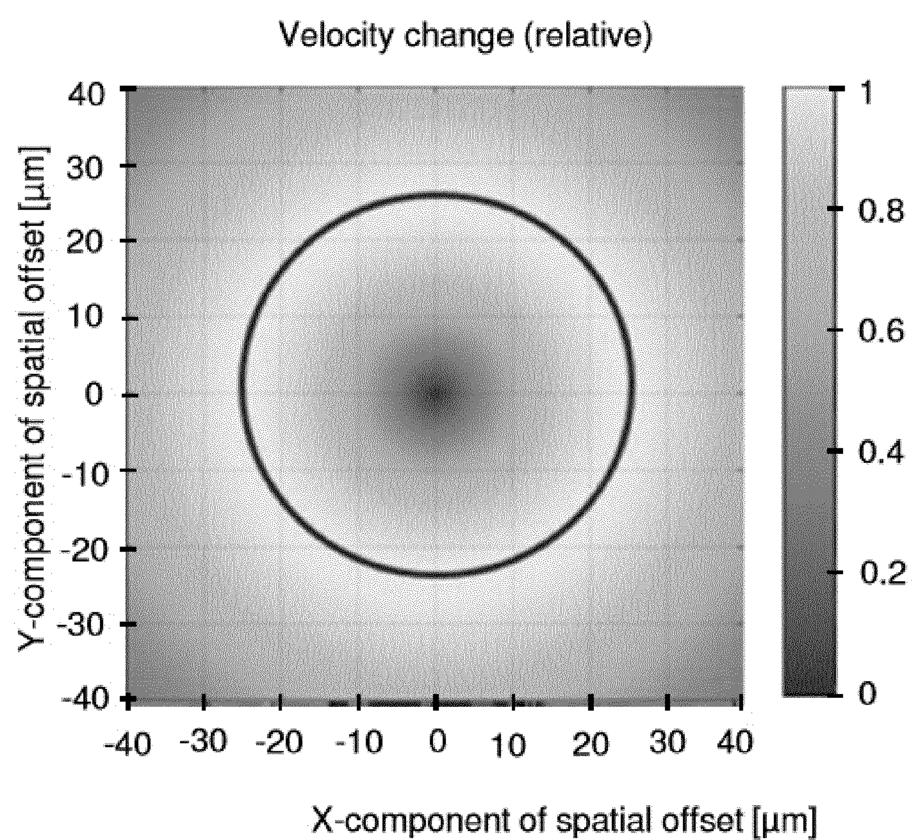
FIG. 5 depicts an intensity map of the velocity change of FIG. 4A in dependence on the spatial offset.

FIG. 5 shows an intensity map of the magnitude of the velocity change Δv in dependence on the magnitudes of the x-component and the y-component of the spatial offset O. The circle indicated by the solid line in FIG. 5 represents values of the x-component and/or y-component of the spatial offset O for which the magnitude of the velocity change Δv may be considered maximized and/or the gradient G may be considered minimized. In this embodiment, the magnitude of each of the x-component and the y-component of the adjusted spatial offset, may be between about 20 μm to 25 μm:

$$|O|=\sqrt{(x^2+y^2)}\approx 25\ \mu\text{m}.$$

The magnitude of the velocity change Δv is indicated on a gray scale in arbitrary units. For example, the darker the region in the intensity map, the smaller is the velocity change, and the lighter the region, the larger is the velocity change.

In examples where the x-component and y-component of the spatial offset O is adjusted to increase above 25 μm, the magnitude of the velocity change Δv may decrease towards zero. This may be due to the pre-pulse PP missing the droplet D. Additionally or alternatively, e.g. if the spatial offset O (e.g. the x-component and/or y-component thereof) is adjusted to increase above 25 μm, expansion of the droplet D, e.g. caused by the pre-pulse PP, may decrease. This in turn may cause a decrease in the size of the conditioned droplet CD, which may affect the spatial overlap between the conditioned droplet CD and the main pulse MP. In other words, the spatial offset O between the droplet D and the pre-pulse PP may be considered as affecting a size of the conditioned droplet, as described above. In examples where the x-component and the y-component of the spatial offset O are adjusted to decrease towards zero, the magnitude of the velocity change Δv may decrease towards zero. This may be due to the spatial offset O between the droplet D and the pre-pulse PP decreasing.

Figure 6A:
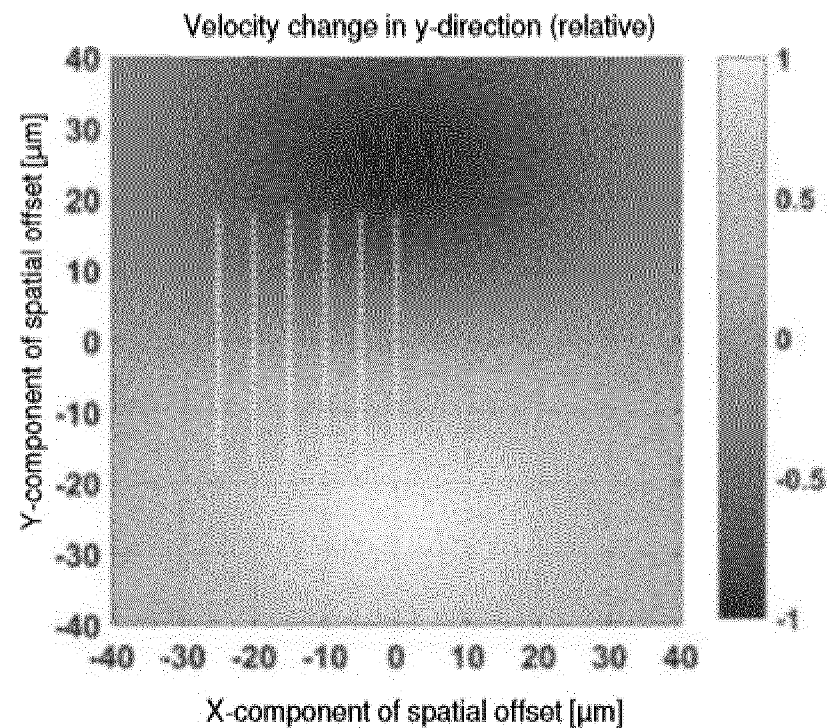
FIG. 6A depicts an intensity map of the velocity change in the y-direction in dependence on the x-component and the y-component of the spatial offset.

FIG. 6A depicts an intensity map of the velocity change Δv in the y-direction in dependence on the x-component and the y-component of the spatial offset O. In the example depicted in FIG. 6A, the spatial offset O in the y-direction is assumed to be zero. The dotted lines in FIG. 6A each represent a series of different values of the spatial offset O in the y-direction, for a fixed value of the spatial offset O in the x-direction. From FIG. 6A it can be seen that a variation of the spatial offset O in the y-direction may cause or result in a variation of the velocity change Δv in the y-direction.

Figure 6B:
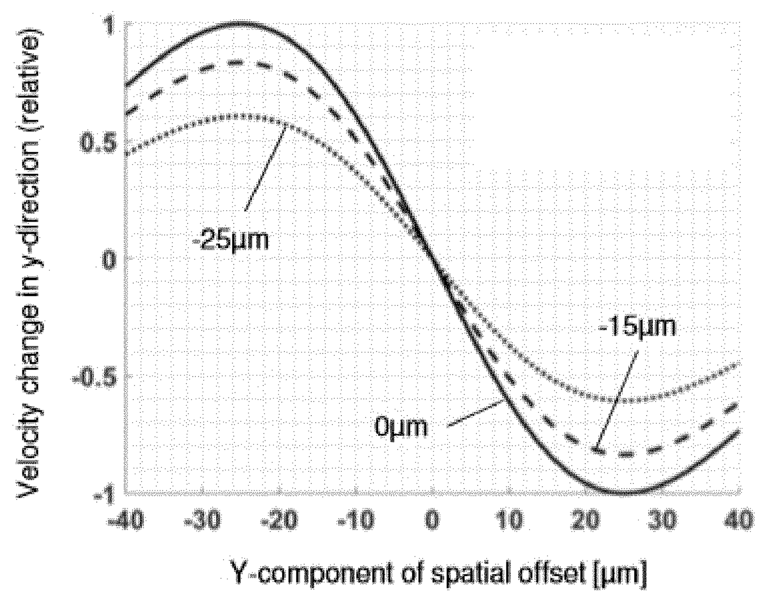
FIG. 6B depicts a graph of the velocity change in the y-direction in dependence of the y-component of the spatial offset for x-components of the spatial offset ranging from 0 μm to −25 μm.

FIG. 6B depicts a graph of the velocity change Δv in the y-direction in dependence of the y-component of the spatial offset O for x-components of the spatial offset ranging from 0 μm to −25 μm (whereby the dotted line represents an x-component of the spatial offset of −25 μm, the dashed line represents an x-component of the spatial offset of −15 μm and the solid line represents an x-component of the spatial offset of zero). From FIG. 6B it can be seen that the gradient G varies with varying x-component of the spatial offset O. For example, in FIG. 6B the magnitude of the gradient G decreases with increasing x-component of the spatial offset O. In other words, a derivative of the velocity change in the y-direction with respect to the y-component of the spatial offset may vary, e.g. decrease, with varying, e.g. increasing, x-component of the spatial offset O, e.g. independent of the y-component of the spatial offset O.

Figure 7:
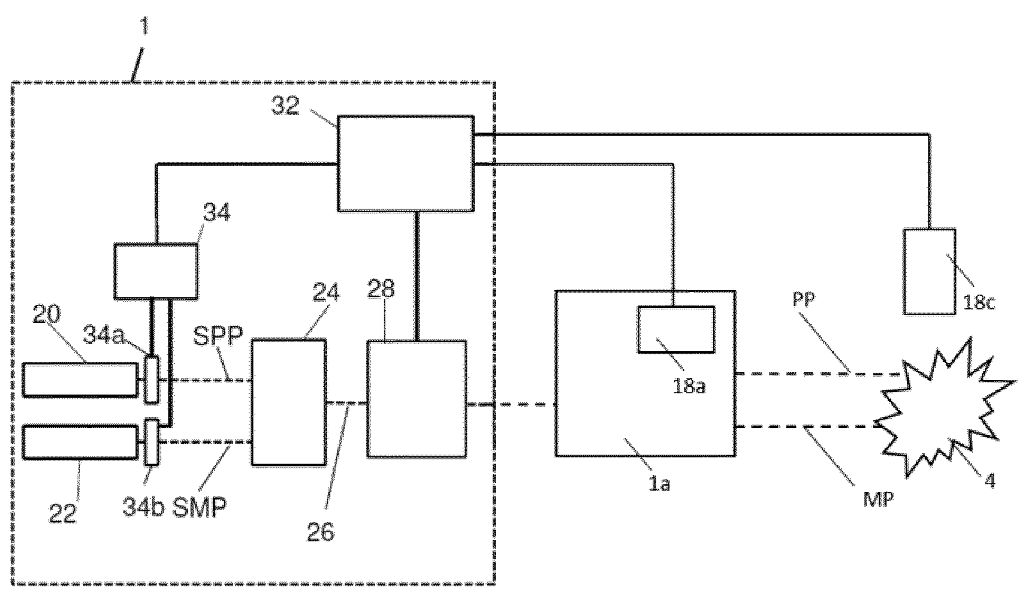
FIG. 7 depicts a laser system for use in the radiation system of FIG. 1 and/or FIG. 2.

FIG. 7 shows a laser system 1 for use in a radiation system RS. The laser system 1 shown in FIG. 7 may be used, part of or comprised in the radiation system RS described above in relation to FIG. 1 and/or FIG. 2. The laser system 1 shown in FIG. 7 may comprise any of the features of the laser system 1 described above.

The laser system 1 may comprise a pre-pulse seed laser 20. The pre-pulse seed laser 20 may be configured to generate a seed pre-pulse SPP. The laser system 1 may comprise a main pulse seed laser 22. The main pulse seed laser 22 may be configured to generate a seed main pulse SMP. The pre-pulse seed laser 20 and the main pulse seed laser 22 may each be provided in the form of a wavelength tunable seed laser, such as for example a $CO_2$ laser. It will be appreciated that the pre-pulse seed laser and/or the main pulse seed laser disclosed herein are/is not limited to being provided in the form of a wavelength tunable seed laser, such as for example a $CO_2$ laser and that in other embodiments other suitable seed laser(s) may be used. For example, at least one of the pre-pulse seed laser and the main pulse seed laser may be provided in the form of a YAG (yttrium-aluminum-garnet) laser, which may provide radiation of a wavelength of about 1 μm. The seed pre-pulse SPP and the seed main pulse SMP may comprise a different wavelength. For example, one the seed pre-pulse SPP and the seed main pulse SMP may comprise a wavelength of about 10.26 μm or 10.207 μm and the other one of the seed pre-pulse SPP and the seed main pulse SMP may comprise a wavelength of about 10.6 μm. This may allow giving the pre-pulse PP and the main-pulse MP different paths, e.g. using one or more optical elements, such as one or more beam splitters, one or more dispersive optical elements, a dichroic mirror, or a combination thereof, e.g. prior to interacting with the droplet D and the conditioned droplet CD, as described above. Exemplary seed lasers are disclosed in US 2013/0321926 A1 and US 2014/0233055 A1 (both in the name of Cymer, Inc., a subsidiary of ASML), the contents of which are hereby incorporated by reference.

The laser system 1 may comprise a combiner 24, such as a beam path combiner. The combiner 24 may be provided in the form of a dichroic mirror. The combiner 24 may be configured to put the seed pre-pulse SPP and the seed main pulse SMP onto a common path 26. An exemplary combiner is disclosed in US 2013/0321926 A1 (in the name of Cymer, Inc., a subsidiary of ASML), the content of which is hereby incorporated by reference.

The laser system 1 may comprise an amplifier system 28. The amplifier system 28 may be located on the common path 26. The amplifier system 28 may be configured to amplify the seed pre-pulse SPP to generate the pre-pulse PP and to amplify the seed main pulse SMP to generate the main pulse MP. The amplifier system 28 may comprise one or more optical or laser amplifiers. For example, the amplifier system 28 may comprise a pre-amplifier and four power amplifiers. It will be appreciated that the amplifier system disclosed herein is not limited to comprising a pre-amplifier and four power amplifiers and that another suitable amplifier arrangement may be used.

As described above, the radiation system RS may comprise the sensor system 18. The sensor system 18 may be configured to sense an attribute or parameter. The attribute or parameter may be part of or comprised in the one or more parameter(s). The attribute or parameter may be indicative of the EUV radiation produced. For example, the attribute or parameter may be indicative of the power of the EUV radiation produced. The sensor system 18 may comprise a third sensor 18*c*. The third sensor 18*c* may be configured to sense the power of the EUV radiation produced. The third sensor 18*c* may be provided in the form of an EUV sensor. The third sensor 18*c* may be arranged in or part of the radiation source SO. The radiation system RS may comprise a plurality of third sensors 18*c* (only one third sensor is shown in FIG. 7), which may be arranged at different angles in the radiation source, e.g. to sense an attribute or parameter of the EUV radiation produced. It will be appreciated that the exemplary sensor system 18 shown in FIG. 7 may also comprise the second sensor 18*b* (e.g. shown in FIG. 2), which is not shown in FIG. 7 for clarity purposes. It will be appreciated that in some embodiments the attribute or parameter of the radiation produced, e.g. the power of the EUV radiation may be sensed by a sensor that may be arranged near of the patterning device MA. In other words, in some embodiments the third sensor may be arranged at or be part of the support structure MT that supports the patterning device MA.

The laser system 1 may comprise an amplifier control system 32. The amplifier control system 32 may be configured to control the amplifying, for example, in dependence on the attribute or parameter sensed. The amplifier control system 32 may be provided in the form of or comprise an Radio Frequency (RF) controller. The RF controller 32 may be configured to apply RF power to the amplifier system 28 to cause amplification of the seed pre-pulse SPP and the seed main pulse SMP. The RF controller 32 may be configured to control and/or adjust a duty cycle of the amplifier system 28. In other words, the RF controller may be configured to control and/or adjust a fraction of time period in which RF power is applied to the amplifier system 28 for amplification of the seed pre-pulse SPP and the seed main pulse SMP. For example, the RF controller 32 may use a drive laser gain command (DLGC), which may be a modulation of the RF power of the amplifier system 28. An exemplary RF controller is disclosed in US 2014/0233005 A1 (in the name of Cymer, Inc., a subsidiary of ASML), the content of which is hereby incorporated by reference.

The sensor system 18, e.g. the sensor 18*c*, may be configured and/or arranged to communicate with the RF controller 32. The sensor system 18, e.g. the sensor 18*c*, may be configured to transmit a signal to the RF controller 32. The signal may be indicative of the sensed attribute or parameter, e.g. the power of the produced radiation. For example, when a decrease in the power of the radiation is sensed or measured, the RF controller 32 may increase the duty cycle of the amplifier system 28. This may result in amplification of the seed pre-pulse SPP and the seed main pulse SMP. This in turn may result in an amplified pre-pulse PP and main pulse MP.

The laser system 1 may comprise a further control system 34. The further control system 34 may be configured to control a duration of the seed pre-pulse SPP in dependence on the attribute or parameter sensed. The attribute or parameter may alternatively or additionally be indicative of the spatial offset and/or of a change of the spatial offset. It will be appreciated that the further control system 34 may alternatively or additionally be configured to control a duration of the seed main pulse SMP, e.g. in dependence on the attribute or parameter sensed, The further control system 34 may comprise a switching device 34*a*. The switching device 34*a* may be provided in the form of an electro-optic modulator (EOM). An exemplary EOM is disclosed in US 2013/0321926 A1 and US 2014/0233055 A1 (both in the name of Cymer, Inc., a subsidiary of ASML), the contents of which are hereby incorporated by reference. The EOM may be considered as acting as a shutter. The EOM may be configured to allow passage of a leading edge of the seed pre-pulse SPP and then may be configured to close so as to cut a tail end of the seed pre-pulse SPP at a desired point. In other words, the switching device 34*a* may be arranged and/or configured to adjust a duration of the seed pre-pulse SPP, for example in response to a signal from the further control system 34. The further control system 34 may comprise a further switching device 34*b*. The further switching device may be the same as the switching device 34*a*. The further switching device 34*b* may be arranged and/or configured to adjust a duration of the seed main pulse SMP.

For example, when a decrease in the produced radiation is sensed by the sensor system 18, e.g. sensor 18*c*, the RF controller 32 may be operative to increase the duty cycle of the amplifier system 28. This may increase the amplification of both the seed pre-pulse SPP and the seed main pulse SMP, since the amplifier system 28 is arranged on the common path 26. The amplification of the seed pre-pulse SPP may cause a variation or change in the spatial offset O between the pre-pulse PP and the droplet D. It will be appreciated that other factors may additionally or alternatively cause a variation or change in the spatial offset. For example, a fluctuation, change or variation, such as for example a random fluctuation, change or variation, in the position of the droplet D and/or the pre-pulse PP in the first x-y-plane may cause a variation or change of the spatial offset O. Alternatively or additionally, a variation or change in the energy of the pre-pulse PP may cause a variation or change of the spatial offset, as will be described below. The variation or change in the spatial offset may cause a variation or change in the velocity change $\Delta v$. The variation or change in the velocity change $\Delta v$ may cause a change or variation in the spatial overlap between the conditioned droplet CD and the main pulse MP, which in turn may cause a change or variation, such as for example a decrease, in the produced EUV radiation.

By controlling the duration of the seed pre-pulse SPP in dependence on the sensed attribute or parameter, the variation or change in the spatial offset and/or velocity change $\Delta v$ may be reduced or compensated. This may reduce or avoid the variation or change in the spatial overlap between the conditioned droplet CD and the main pulse MP, thereby reducing or preventing a decrease in the power of the produced EUV radiation, EUV radiation instability and/or errors or fluctuations in EUV radiation power.

The sensor system 18 may be configured to sense the spatial offset O between the droplet and the pre-pulse PP or a change thereof. A change in the spatial offset may be due to the amplification of the seed pre-pulse SPP and the seed main pulse SMP by the amplifier system and/or due to a fluctuation, change or variation, such as for example a random fluctuation, change or variation, in the position of the droplet D and/or the pre-pulse PP in the first x-y-plane, as described above.

The sensor system 18, e.g. the first sensor 18*a*, may be configured and/or arranged to communicate with the RF controller 32. The sensor system 18, e.g. the first sensor 18*a*, may transmit a signal to the RF controller 32. The signal may be indicative of the sensed attribute or parameter, e.g. the spatial offset O or a change thereof. The further control system 34 may be configured to adjust the duration of the seed pre-pulse in dependence on the sensed attribute or parameter, e.g. the spatial offset or change thereof. For example, the further control system 34 may be configured and/or arranged to communicate with the RF controller 32. The further control system 34 may be configured to adjust the duration of the seed pre-pulse SPP in response to a signal from the RF controller 32. As described above, the laser system 1 may comprise the beam delivery system 1*a*. The beam delivery system 1*a* may be configured to separate the pre-pulse PP and the main pulse MP, e.g. using one or more optical elements, such as one or more beam splitters, one or more dispersive optical elements, a dichroic mirror, or a combination thereof, as described above. The beam delivery system 1*a* may be configured to direct the pre-pulse PP and the main pulse MP towards the plasma formation region 4. The beam delivery system 1*a* may determine a position of the pre-pulse PP in the first x-y-plane, a position of the main pulse in the second x-y-plane and/or the separation S between the pre-pulse PP in the first x-y-plane and the main pulse MP in the second x-y-plane. For example in response to a signal from a control system, e.g. the control system 16, the beam delivery system 1*a* may adjust the position of the pre-pulse PP in the first x-y-plane, the position of the main pulse in the second x-y-plane and/or the separation S between the pre-pulse PP in the first x-y-plane and the main pulse MP in the second x-y-plane. Alternatively or additionally, the RF controller 32 and/or the further control system 34 may be arranged to be in communication with the beam delivery system 1*a*.

Figure 8A:
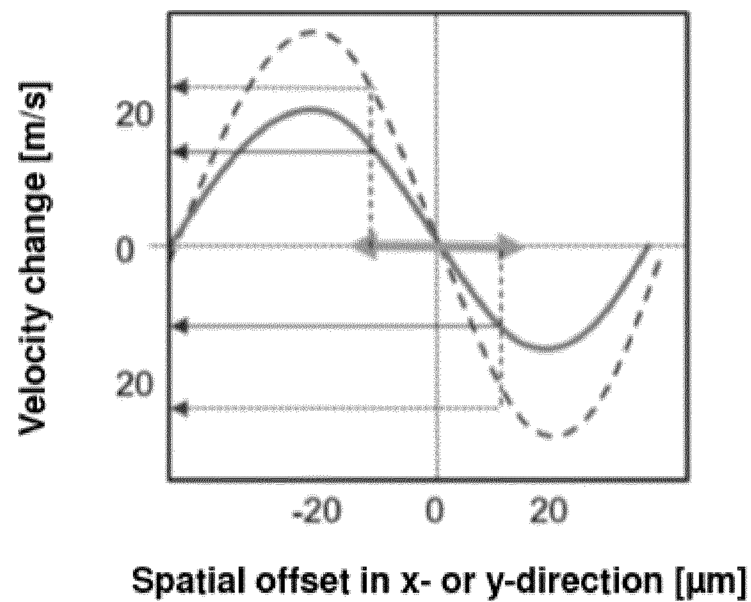
FIG. 8A depicts a graph of the velocity change in dependence on the spatial offset in the x- or y-direction.
Figure 8B:
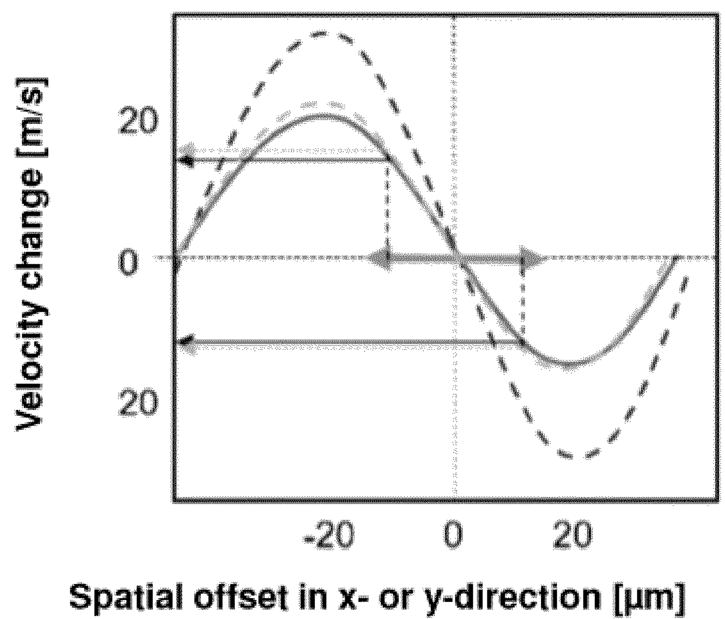
FIG. 8B depicts another graph of the velocity change in dependence on the spatial offset in the x- or y-direction.

FIGS. 8A and 8B each show a graph of a magnitude of the velocity change Δv in dependence on the spatial offset O in the first x-y-plane. In both Figures the y-component of the spatial offset is considered to be zero for convenience. It will be appreciated that in other embodiments the y-component of the spatial offset may be larger or smaller than zero.

FIG. 8A depicts a graph of the magnitude of the velocity change Δv in dependence on the spatial offset O in the x- or y-direction. FIG. 8A shows the variation or change in the magnitude of the velocity change Δv, which may result from the amplification of the seed pre-pulse SPP and seed main pulse SMP described above. The solid curve in FIG. 8A illustrates the magnitude of the velocity change Δv in dependence on the spatial offset for nominal amplification of the seed pre-pulse SPP (e.g. amplification of the seed pre-pulse SPP that may be applied during normal operation of the laser system 1, e.g. the radiation system RS). The dashed curve in FIG. 8A illustrates the magnitude of the velocity change Δv in dependence on the spatial offset for increased amplification, e.g. increased relative to the nominal amplification, of the seed pre-pulse SPP. It can be seen that a change or variation in the spatial offset O may cause an increase in the velocity change Δv for the increased amplification of the seed pre-pulse SPP. This increase in the magnitude of the velocity change Δv may cause a change or variation in the spatial overlap between the conditioned droplet CD and the main pulse MP. This is turn may cause a decrease in the power of the produced EUV radiation, EUV radiation instability and/or errors or fluctuations in EUV radiation power. It will be appreciated that the increased velocity change (dashed curve in FIG. 8A) may additionally or alternatively be due to a fluctuation, change or variation, such as for example a random fluctuation, change or variation, in the position of the droplet D and/or the pre-pulse PP in the first x-y-plane FIG. 8B depicts another graph of the magnitude of the velocity change Δv in dependence on the spatial offset in the x- or y-direction. FIG. 8B is similar to FIG. 8A. FIG. 8B additionally shows the magnitude of the velocity change Δv in dependence on the spatial offset O subsequent to the adjustment of the duration of the seed pre-pulse SPP, which is illustrated by the light-grey dashed curve. In the example shown in FIG. 8B, the duration of the seed pre-pulse SPP was adjusted, e.g. decreased, by the further control system 34. It will be appreciated that the disclosed further control system is not limited to decreasing the duration of the seed pre-pulse and that, for example, in other embodiments the duration of the seed pre-pulse may be increased. By decreasing the duration of the seed pre-pulse SPP, the magnitude of the velocity change Δv may remain substantially unchanged or be similar to the magnitude of the velocity change Δv for the nominal amplification of the seed pre-pulse SPP and/or prior a fluctuation, change or variation, such as for example a random fluctuation, change or variation, in the position of the droplet D and/or the pre-pulse PP in the first x-y-plane. This may prevent or reduce a variation or change in the spatial overlap between the conditioned droplet CD and the main pulse MP. In other words, the further control system 34 may be configured to adjust the duration of the seed pre-pulse SPP so that the magnitude of the velocity change Δv is unchanged, e.g. substantially unchanged, or constant, e.g. when the seed pre-pulse SPP is amplified in dependence on the attribute or parameter sensed and/or a fluctuation, change or variation (e.g. a random fluctuation, change or variation) in the position of the droplet D and/or the pre-pulse PP in the first x-y-plane is present or occurs. This may allow for compensation of the decrease in radiation in response to amplification of the seed pre-pulse and/or due to a fluctuation, change or variation (e.g. a random fluctuation, change or variation) in the position of the droplet D and/or the pre-pulse PP in the first x-y-plane.

It will be appreciated that the laser system 1 shown in FIG. 7 may be used in a radiation system that does not comprise the control system 16 described above. In other words, the duration of the seed pre-pulse SPP may be controlled independently from or without adjusting the spatial offset O so as to maximize a velocity change Δv of the conditioned droplet CD in second x-y-plane. Alternatively, the laser system 1 shown in FIG. 7 may be used in combination with the radiation system RS, e.g. the control system 16, shown in FIG. 2 and described above.

Figure 9:
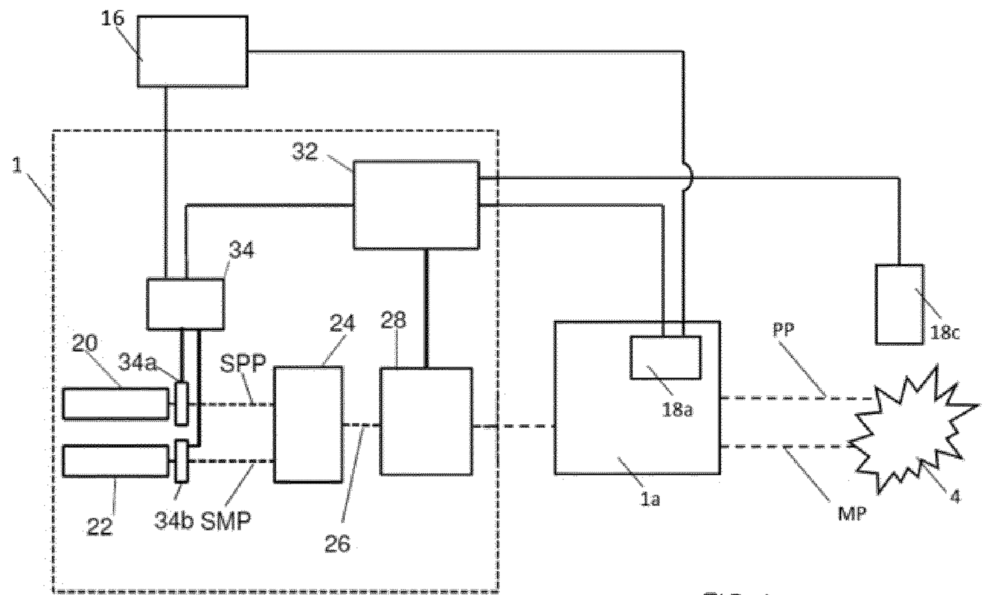
FIG. 9 depicts a laser system and control system for use in the radiation system of FIG. 1 and/or FIG. 2.

FIG. 9 depicts a laser system 1 and a control system 16 for use in a radiation system. The laser system 1 and control system 16 shown in FIG. 9 may be used, part of or comprised in the radiation system RS described above in relation to FIG. 1 and/or FIG. 2. The laser system 1 shown in FIG. 9 is the same as the laser 1 shown in FIG. 7. It will be appreciated that in other embodiment a different laser system or arrangement thereof may be used. The laser system 1 may be configured and/or arranged to communicate with the control system 16, described above. The control system 16 shown in FIG. 9 may comprise any of the features of the control system 16 described above. The control system 16 may be arranged to communicate with at least a part of the sensor system 18, e.g. the first sensor 18*a*, as described above. It will be appreciated that in other embodiments the control system may be arranged to additionally or alternatively communicate with the second sensor and/or third sensor.

Referring to FIG. 9, the control system 16 may be operative to maximize the magnitude of the velocity change Δv through control of the duration of the pre-pulse PP. The duration of the pre-pulse PP may be adjusted by adjusting the duration of the seed pre-pulse SPP, as described above. For example, the control system 16 may be in communication with the further control system 34. As described above, the further control system 34 may comprise the switching device 34*a* and/or the further switching device 34*b*. The control system 16 may transmit a signal to the further control system 34. The signal may be indicative of the duration of the seed pre-pulse SPP. The switching device 34*a* may adjust the duration of the seed pre-pulse SPP, for example in response to a signal from the further control system 34. The duration of the pre-pulse PP, e.g. the seed pre-pulse SPP, may be varied between, say, 40 ns and 180 ns. It will be appreciated that in some embodiments the further control system 34 and/or the switching devices 34*a*, 34*b* may be part of, or comprised in, the control system 16.

The control system 16 may be operative to maximize the magnitude of the velocity change Δv through control of the duration of the pre-pulse PP in addition to, or instead of, being configured to adjust the spatial offset O so as to maximize the magnitude of the velocity change Δv of the conditioned droplet CD in the second x-y-plane, as described above.

Additionally or alternatively, the control system 16 may be operative to control and/or adjust the velocity change through control of the duration of the pre-pulse PP. For example, the control system 16 may be operative to control and/or adjust the velocity change through control of the duration of the pre-pulse PP such that the spatial overlap between the conditioned droplet CD and the main pulse MP in the second x-y-plane is optimized or maximized. The control system 16 may be configured to maintain the velocity change through control of the duration of the pre-pulse PP, e.g. such that the spatial overlap between the conditioned droplet CD and the main pulse MP in the second x-y-plane is optimized or maximized. This may result in an increase in the power of the EUV radiation produced, increased EUV radiation stability and/or a decrease in errors or fluctuations in EUV radiation power.

The control system 16 may be operative to adjust the duration of the pre-pulse PP based on the separation S of the pre-pulse PP in the first x-y-plane and the main pulse MP in the second x-y-plane (see FIG. 3). The separation S between the pre-pulse PP in the first x-y-plane and the main pulse MP in the second x-y-plane may change or vary in the x-direction and/or the y-direction, e.g. due to thermally induced effects in the radiation system RS, e.g. the laser system 1. The control system 16 may be operative to adjust the duration of the pre-pulse PP based on the separation S of the pre-pulse PP in the first x-y-plane and the main pulse MP in the second x-y-plane, e.g. if the spatial offset O between the droplet D and the pre-pulse PP is fixed or set. By adjusting the duration of the pre-pulse PP based on the separation S of the pre-pulse PP in the first x-y-plane and the main pulse MP in the second x-y-plane, the spatial overlap between the conditioned droplet CD and the main pulse MP may be adjusted, e.g. to optimize or maximize the spatial overlap between the conditioned droplet CD and the main pulse MP.

Figure 10:
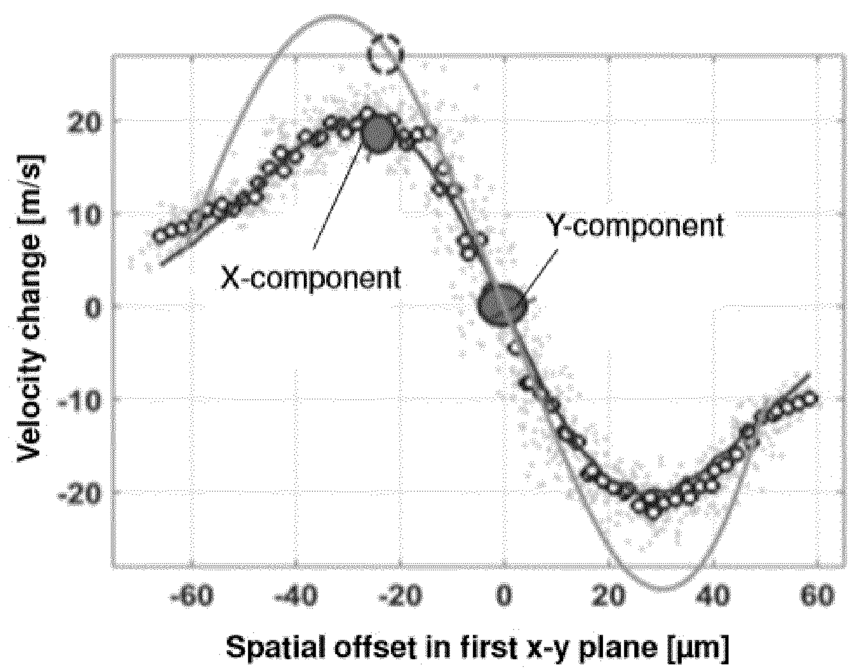
FIG. 10 depicts a graph of the velocity change in dependence on the spatial overlap in the first x-y-plane.

FIG. 10 depicts a graph of the magnitude of the velocity change Δv in dependence on the spatial overlap in the first x-y-plane. The small light grey dots in FIG. 10 represent measured values of the velocity change, the open circles represent average values of the measured velocity change and the solid line represents a curve fitted to the average values of the velocity change. In this example, the spatial offset O has been selected so that the value of the y-component of the spatial offset O is fixed at, e.g., zero and the value of the x-component may vary. In other words, there is a spatial offset O in the x-direction and no spatial offset in the y-direction in this example. However, it will be appreciated that in other embodiments the y-component may be selected to vary, e.g. larger or smaller than zero, the x-component may be selected to be fixed, e.g., at zero, or both the x-component and the y-component may be selected to be variable.

In FIG. 10, the grey solid line illustrates the velocity change in dependence on the spatial offset in the first x-y-plane for an increased duration of the pre-pulse PP relative to the velocity change indicated by the circles and the black solid line. From FIG. 10, it can be seen that the magnitude of the velocity change Δv may be varied, e.g. increased or decreased, for a given spatial offset O through control of the duration of the pre-pulse PP. In other words, the velocity change Δv may be varied through control of the duration of the pre-pulse PP, e.g. independently from, or without varying, the spatial offset O. It can also be seen that, for example, the velocity change Δv in the x-direction may be varied or adjusted, e.g. increased, independently from the velocity change Δv in the y-direction by adjusting, e.g. increasing, the duration of the pre-pulse PP and setting the y-component of the spatial offset O to, e.g., zero. It will be appreciated that in other embodiments the velocity change in the y-direction can be adjusted, e.g. increased, independently from the velocity change in the x-direction by adjusting, e.g. increasing, the duration of the pre-pulse PP and setting the x-component of the spatial offset O to, e.g., zero.

The control system 16 may be operative to adjust the duration of the pre-pulse PP in response to a change of energy of the pre-pulse PP. For example, the change of energy of the pre-pulse PP may be due to degradation in an amplification medium that may be part of or comprised in the amplifier system 28. Alternatively or additionally, the change of energy of the pre-pulse may be due to a change in a beam path, such as for example absorption or a change thereof, of the seed pre-pulse SPP, the seed main pulse SMP, the pre-pulse PP and/or the main pulse MP. The change in energy of the pre-pulse PP may cause a change or variation in the velocity change Δv, which in turn may cause a change or variation in the spatial overlap between the conditioned droplet CD and the main-pulse MP.

Figure 11:
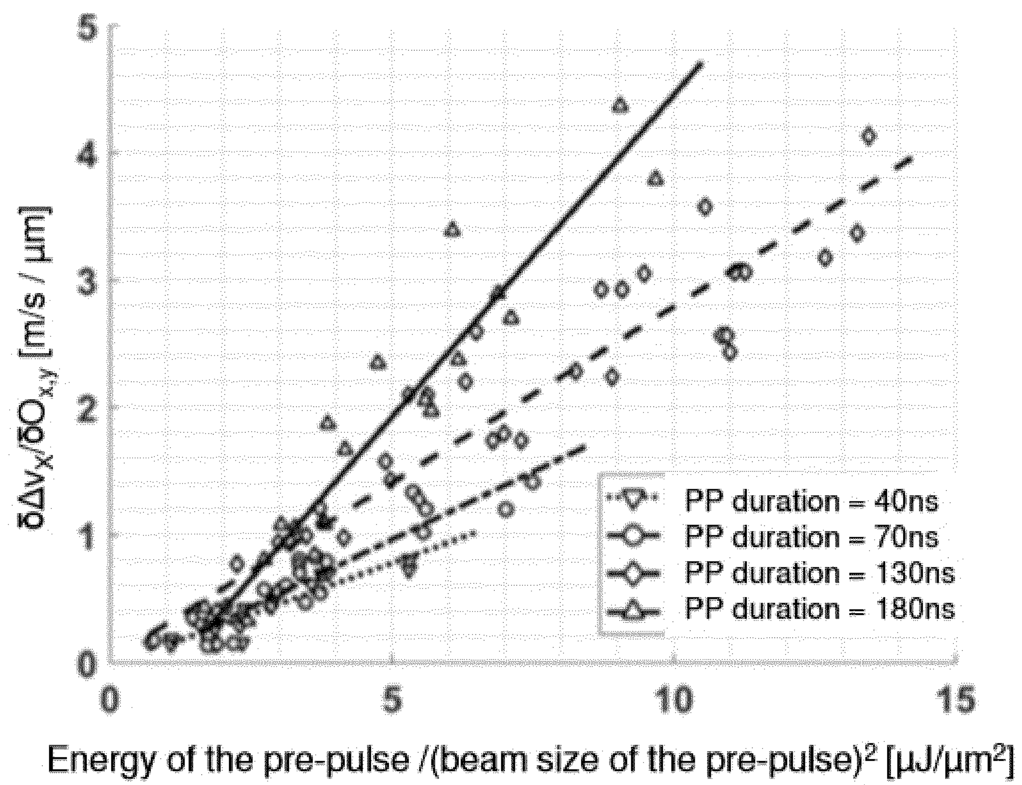
FIG. 11 depicts a graph of the derivative of the velocity change in the x-direction over the spatial offset in dependence on the fluence or radiant exposure by the pre-pulse on the droplet for pre-pulse durations varying between 40 ns and 180 ns.

FIG. 11 depicts graphs of the derivative of the velocity change in the x-direction with respect to the magnitude of the spatial offset O (or the magnitude of the gradient G) as a function of the fluence or radiant exposure by the pre-pulse PP, on the droplet D. FIG. 11 includes graphs for pre-pulse PP durations having values of 40 ns, 70 ns, 130 ns and 180 ns. In FIG. 11, the fluence or radiant exposure by the pre-pulse PP is indicated as the ratio of the energy of the pre-pulse and a beam size of the pre-pulse squared. From FIG. 11 it can be seen that the magnitude of the derivative increases with increasing duration and with increasing energy of the pre-pulse PP. The velocity change Δv in the x-direction may be considered as being dependent on the duration of the pre-pulse PP and/or on the energy of the pre-pulse PP. It will be appreciated that in other embodiments the derivative of velocity change in the y-direction and/or z-direction with respect to the magnitude of the spatial offset may additionally or alternatively vary, e.g. increase, with varying, e.g. increasing, duration and/or energy of the pre-pulse PP. Additionally or alternatively, the velocity change may itself be considered as being dependent on the duration of the pre-pulse and/or on the energy of the pre-pulse, as well as on the spatial overlap.

The control system 16 may be operative to adjust the duration of the pre-pulse in response to a change in the separation S of the pre-pulse PP in first x-y-plane and the main pulse MP in the second x-y-plane. This may allow the spatial overlap between the conditioned droplet CD and the main pulse MP to be unchanged and/or compensated for drifts in a position of the pre-pulse PP in the first x-y-plane and/or in the main-pulse MP in the second x-y-plane.

Figure 12:
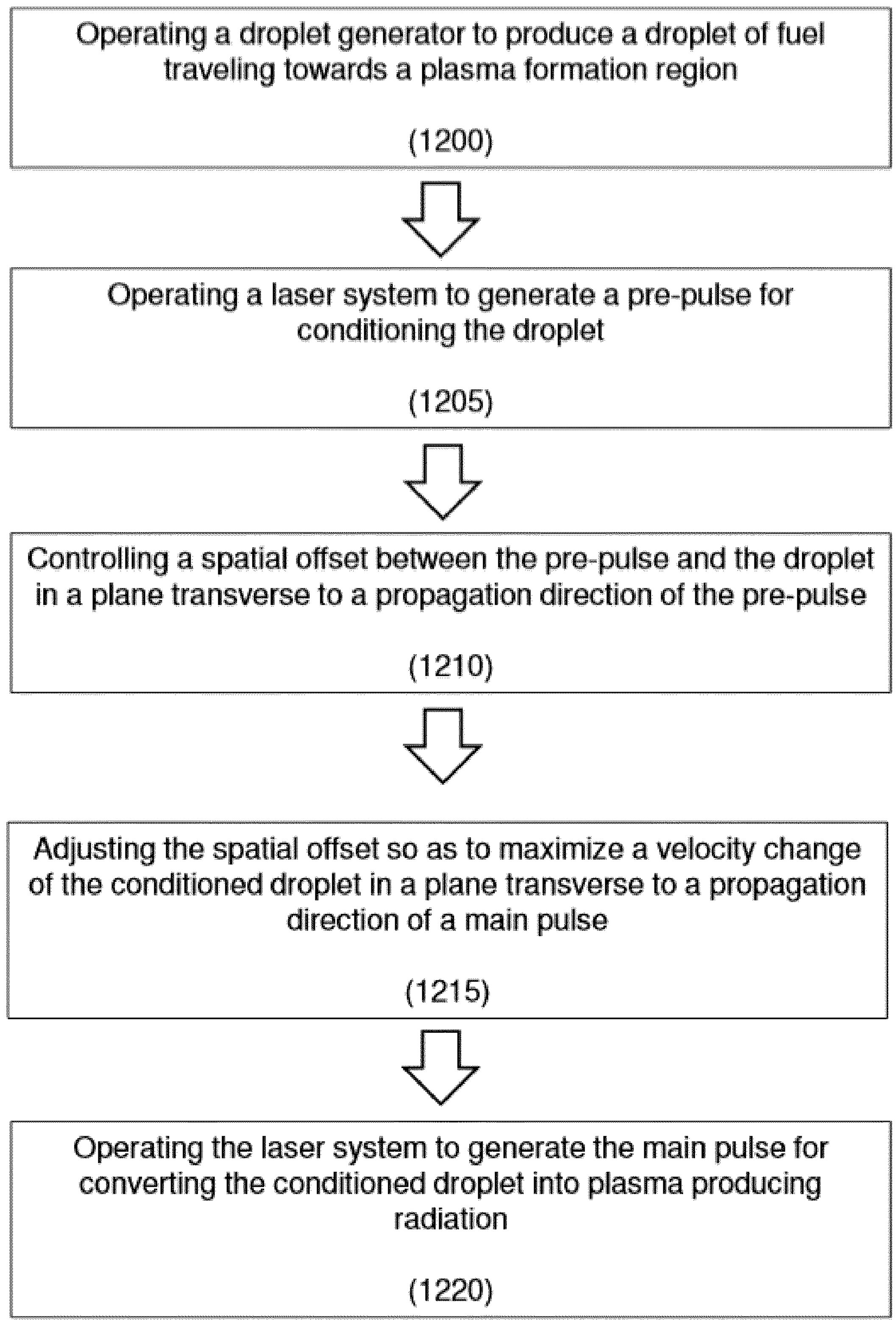
FIG. 12 depicts a flowchart of a method of producing radiation.

FIG. 12 depicts a flowchart of a method of producing EUV radiation. The method may comprise operating the droplet generator 3 to produce a droplet of fuel traveling towards the plasma formation region 4 (step 1200). The method may comprise operating the laser system 1 to generate a pre-pulse PP for conditioning the droplet D (step 1205). In step 1210, the method may comprise controlling the spatial offset O between the pre-pulse PP and the droplet in a plane transverse to the propagation direction of the pre-pulse PP, e.g. the first x-y-plane. The method may comprise adjusting the spatial offset O so as to maximize the velocity change $\Delta v$ of the conditioned droplet in a plane transverse to a propagation direction of the main pulse MP (step 1215). In step 1220, the method may comprise operating the laser system 1 to generate the main pulse MP for converting the conditioned droplet CD into plasma producing EUV radiation.

FIG. 13 depicts a flowchart of method steps, which may be part of or comprised in the method depicted in FIG. 12. It will be appreciated that only some of the method steps depicted in FIG. 13 may be part of or comprised in the method depicted in FIG. 12. Alternatively, all or none of the method steps depicted in FIG. 13 may be part of or comprised in the method depicted in FIG. 12. In other words, the method steps depicted in FIG. 13 may be used in isolation of some or all of the method steps depicted in FIG. 12 or in combination with at least one or all method steps depicted in FIG. 12.

In step 1300, the method may comprise operating the pre-pulse seed laser 20 to generate the seed pre-pulse SPP. The method may comprise operating the main pulse seed laser 22 to generate the seed main pulse SMP (step 1305). The pre-pulse seed laser 20 and the main pulse seed laser 22 may be part of or comprised in the laser system 1. The seed pre-pulse SPP and the seed main pulse SMP may be put onto the common path 26 by the combiner 24. The method may comprise operating the amplifier system 18 located on the common path 26 (step 1310). The amplifier system 28 may be configured to amplify the seed pre-pulse SPP to generate the pre-pulse PP and to amplify the seed main pulse SMP to generate the main pulse MP. In step 1315, the method may comprise sensing an attribute or parameter as discussed above with reference to FIGS. 7 and 9. The method may comprise operating the amplifier control system 32 (step 1320). The amplifier control system 32 may be configured to control the amplifying in dependence on the attribute or parameter sensed. The method may comprise operating the further control system 34, e.g. comprising the switching device 34*a*, configured to control the duration of the seed pre-pulse SPP in dependence on the attribute or parameter sensed (1325).

Figure 14:
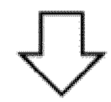
FIG. 14 depicts a flowchart of method steps, which may be part of or comprised in the method depicted in FIG. 12 and/or FIG. 13.

FIG. 14 depicts a flowchart of other method steps, which may be part of or comprised in the method depicted in FIG. 12 and/or FIG. 13. The method steps depicted in FIG. 14 may be used in isolation of each other, in isolation of the methods (or method steps) depicted in FIGS. 12 and/or 13 or in combination with at least one or all method steps depicted in FIG. 12 and/or FIG. 13.

In step 1400, the attribute or parameter comprises at least one of: a power of the EUV radiation produced, and the spatial offset, a change in the spatial offset.

In step 1405, the method may comprise controlling a duration of the pre-pulse PP to maximize the velocity change $\Delta v$.

It will be appreciated that the term "duration" of the pre-pulse may be considered as encompassing a length of the pre-pulse PP.

It will be appreciate that the term "radiation" may be considered as encompassing EUV radiation and that these terms may be used interchangeably.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation system comprising:

a droplet generator configured to produce a droplet of fuel traveling towards a plasma formation region;

a laser system operative to generate a pre-pulse and a main pulse, wherein:

the pre-pulse is configured to condition the droplet for receipt of the main pulse, and the main pulse is configured to convert the conditioned droplet into plasma producing radiation;

a sensor system configured to sense an attribute or parameter of the radiation; and a control system coupled to the sensor system and one or both of the droplet generator and the laser system, the control system configured to control a spatial offset between the pre-pulse and the droplet in a plane transverse to a propagation direction of the pre-pulse by sending a signal to at least one of the droplet generator or the laser system based on the attribute or parameter, and wherein the control system is configured to adjust the spatial offset so as to maximize a velocity change of the conditioned droplet in a plane transverse to a propagation direction of the main pulse.

2. The radiation system of claim 1, wherein the control system is configured to adjust a separation between the pre-pulse in the plane transverse to the propagation direction of the pre-pulse and the main pulse in the plane transverse to the propagation direction of the main pulse based on an adjusted spatial offset.

3. The radiation system of claim 1, wherein the control system is configured to adjust a delay time between a generation of the pre-pulse and a generation of the main pulse based on an adjusted spatial offset.

4. The radiation system of claim 1, wherein the laser system is configured to direct the main pulse towards a target region, the conditioned droplet being converted into plasma producing radiation at the target region.

5. The radiation system of claim 4, wherein the control system is configured to adjust the target region based on:

an adjusted spatial offset;

the velocity change;

a separation between the pre-pulse in the plane transverse to the propagation direction of the pre-pulse and the main pulse in the plane transverse to the propagation direction of the main pulse; or a delay time between a generation of the pre-pulse and a generation of the main pulse.

6. The radiation system of claim 1, wherein the attribute or parameter comprises at least one of:

a position of the droplet in the plane transverse to the propagation direction of the pre-pulse;

a position of the pre-pulse in the plane transverse to the propagation direction of the pre-pulse;

a change in the position of the droplet in the plane transverse to the propagation direction of the pre-pulse;

a change in the position of the pre-pulse in the plane transverse to the propagation direction of the pre-pulse;

a position of the main pulse in the plane transverse to the propagation direction of the main pulse; or a change in the position of the main pulse in the plane transverse to the propagation direction of the main pulse.

7. The radiation system of claim 1, wherein the control system is operative to maximize the velocity change through control of a duration of the pre-pulse.

8. The radiation system of claim 1, wherein the control system is operative to adjust a duration of the pre-pulse based on a change of energy of the pre-pulse.

9. A radiation system comprising:

a droplet generator configured to produce a droplet of fuel traveling towards a plasma formation region;

a laser system operative to generate a pre-pulse and a main pulse, wherein:

the pre-pulse is configured to condition the droplet for receipt of the main pulse, and the main pulse is configured to convert the conditioned droplet into plasma producing radiation;

a sensor system configured to sense an attribute or parameter of the radiation; and a control system coupled to a switching device, the control system configured to send a signal to the switching device to adjust a duration of the pre-pulse based on the attribute or parameter to control a velocity change of the conditioned droplet in a plane transverse to a propagation direction of the main pulse.

10. A lithographic system comprising:

a radiation system configured to produce radiation;

a droplet generator configured to produce a droplet of fuel traveling towards a plasma formation region;

a laser system operative to generate a pre-pulse and a main pulse, wherein:

the pre-pulse is configured to condition the droplet for receipt of the main pulse, and the main pulse is configured to convert the conditioned droplet into plasma producing radiation;

a sensor system configured to sense an attribute or parameter of the radiation; and a control system coupled to the sensor system and one or both of the droplet generator and the laser system, the control system configured to control a spatial offset between the pre-pulse and the droplet in a plane transverse to a propagation direction of the pre-pulse by sending a signal to at least one of the droplet generator or the laser system based on the attribute or parameter, and wherein the control system is configured to adjust the spatial offset so as to maximize a velocity change of the conditioned droplet in a plane transverse to a propagation direction of the main pulse.

11. The radiation system of claim 1, wherein the laser system comprises:

a pre-pulse seed laser configured to generate a seed pre-pulse;

a main pulse seed laser configured to generate a seed main pulse;

a combiner configured to put the seed pre-pulse and the seed main pulse onto a common path;

an amplifier system located on the common path and configured to amplify the seed pre-pulse to generate the pre-pulse and to amplify the seed main pulse to generate the main pulse;

an amplifier control system configured to control the amplifying in dependence on the attribute or parameter sensed; and a further control system configured to control a duration of the seed pre-pulse in dependence on the attribute or parameter sensed.

12. The radiation system of claim 11, wherein the further control system is configured to adjust the duration of the seed pre-pulse so that the velocity change is substantially unchanged or constant when the seed pre-pulse and seed main pulse are amplified in dependence on the attribute or parameter sensed.

13. The radiation system of claim 1, wherein the attribute or parameter comprises:

a power of the radiation produced;

the spatial offset; or a change in the spatial offset.

14. A lithographic system comprising:

a radiation system configured to produce radiation;

a droplet generator configured to produce a droplet of fuel traveling towards a plasma formation region;

a laser system operative to generate a pre-pulse and a main pulse, wherein:

the pre-pulse is configured to condition the droplet for receipt of the main pulse, and the main pulse is configured to convert the conditioned droplet into plasma producing radiation;

a sensor system configured to sense an attribute or parameter of the radiation; and a control system coupled to a switching device, the control system configured to send a signal to the switching device to adjust a duration of the pre-pulse based on the attribute or parameter to control a velocity change of the conditioned droplet in a plane transverse to a propagation direction of the main pulse.

* * * * *

UNITED STATES PATENT AND TRADEMARK OFFICE

CERTIFICATE OF CORRECTION

PATENT NO. : 12,363,818 B2
APPLICATION NO. : 17/600759
DATED : July 15, 2025
INVENTOR(S) : Dingemans et al.

It is certified that error appears in the above-identified patent and that said Letters Patent is hereby corrected as shown below:

In the Specification

In Column 11, Line 2, delete "$6\Delta v_x$" and replace with -- $\delta\Delta v_x$ --.

Signed and Sealed this
Second Day of September, 2025

Coke Morgan Stewart
*Acting Director of the United States Patent and Trademark Office*